(12) United States Patent
Oh

(10) Patent No.: US 12,181,789 B2
(45) Date of Patent: Dec. 31, 2024

(54) CAMERA DEVICE

(71) Applicant: LG INNOTEK CO., LTD., Seoul (KR)

(72) Inventor: Jung Seok Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 664 days.

(21) Appl. No.: 17/310,924

(22) PCT Filed: Mar. 17, 2020

(86) PCT No.: PCT/KR2020/003644
§ 371 (c)(1),
(2) Date: Aug. 31, 2021

(87) PCT Pub. No.: WO2020/197149
PCT Pub. Date: Oct. 1, 2020

(65) Prior Publication Data
US 2022/0137486 A1    May 5, 2022

(30) Foreign Application Priority Data

Mar. 28, 2019    (KR) .................. 10-2019-0035662

(51) Int. Cl.
*G03B 5/00*    (2021.01)
*H04N 23/54*    (2023.01)
(Continued)

(52) U.S. Cl.
CPC .............. *G03B 5/00* (2013.01); *H04N 23/54* (2023.01); *H04N 23/55* (2023.01); *H04N 23/687* (2023.01); *G03B 2205/0069* (2013.01)

(58) Field of Classification Search
CPC ........ G02B 27/646; G02B 7/023; G02B 7/08; G02B 7/09; G02B 7/04; G02B 7/102;
(Continued)

(56) References Cited

U.S. PATENT DOCUMENTS

2012/0082442 A1*    4/2012    Kwon ................... H04N 23/55
                                                                                396/55
2013/0120861 A1*    5/2013    Park ..................... G02B 13/009
                                                                                359/824
(Continued)

FOREIGN PATENT DOCUMENTS

CN        101990755 A        3/2011
CN        102445811 A        5/2012
(Continued)

OTHER PUBLICATIONS

International Search Report dated Jul. 2, 2020 in International Application No. PCT/KR2020/003644.
(Continued)

*Primary Examiner* — Ephrem Z Mebrahtu
(74) *Attorney, Agent, or Firm* — Saliwanchik, Lloyd & Eisenschenk

(57) ABSTRACT

The present embodiment relates to a camera device including a magnet and a coil. The magnet includes: a first magnet disposed on each of first and second side surfaces of a camera module, and having a different polarity in a top portion and a bottom portion of the surface facing the coil; and a second magnet disposed on each of third and fourth side surfaces of the camera module, and having a different polarity on both side portions of the surface facing the coil. The coil includes: a first coil facing the first magnet; a second coil facing the first magnet and electrically separated from the first coil; and a third coil facing the second magnet and electrically separated from the first and second coils.

19 Claims, 21 Drawing Sheets

(51) Int. Cl.
*H04N 23/55* (2023.01)
*H04N 23/68* (2023.01)

(58) Field of Classification Search
CPC .......... G02B 7/10; H04N 23/57; H04N 23/51; H04N 23/687; H04N 23/54
See application file for complete search history.

(56) References Cited

U.S. PATENT DOCUMENTS

| | | | | |
|---|---|---|---|---|
| 2013/0136437 | A1* | 5/2013 | Asakawa | G02B 27/64 396/55 |
| 2016/0048002 | A1* | 2/2016 | Cheng | G02B 27/646 359/557 |

FOREIGN PATENT DOCUMENTS

| | | |
|---|---|---|
| CN | 105652557 A | 6/2016 |
| CN | 108351484 A | 7/2018 |
| JP | 2012-211995 A | 11/2012 |
| KR | 10-1064131 B1 | 9/2011 |
| KR | 10-1085645 B1 | 11/2011 |
| KR | 10-2015-0127792 A | 11/2015 |
| KR | 10-2017-0092809 A | 8/2017 |
| KR | 10-2019-0029169 A | 3/2019 |
| WO | 2018/182203 A1 | 10/2018 |

OTHER PUBLICATIONS

Office Action dated May 26, 2023 in Chinese Application No. 202080025679.3.

* cited by examiner

Elastic Deformation

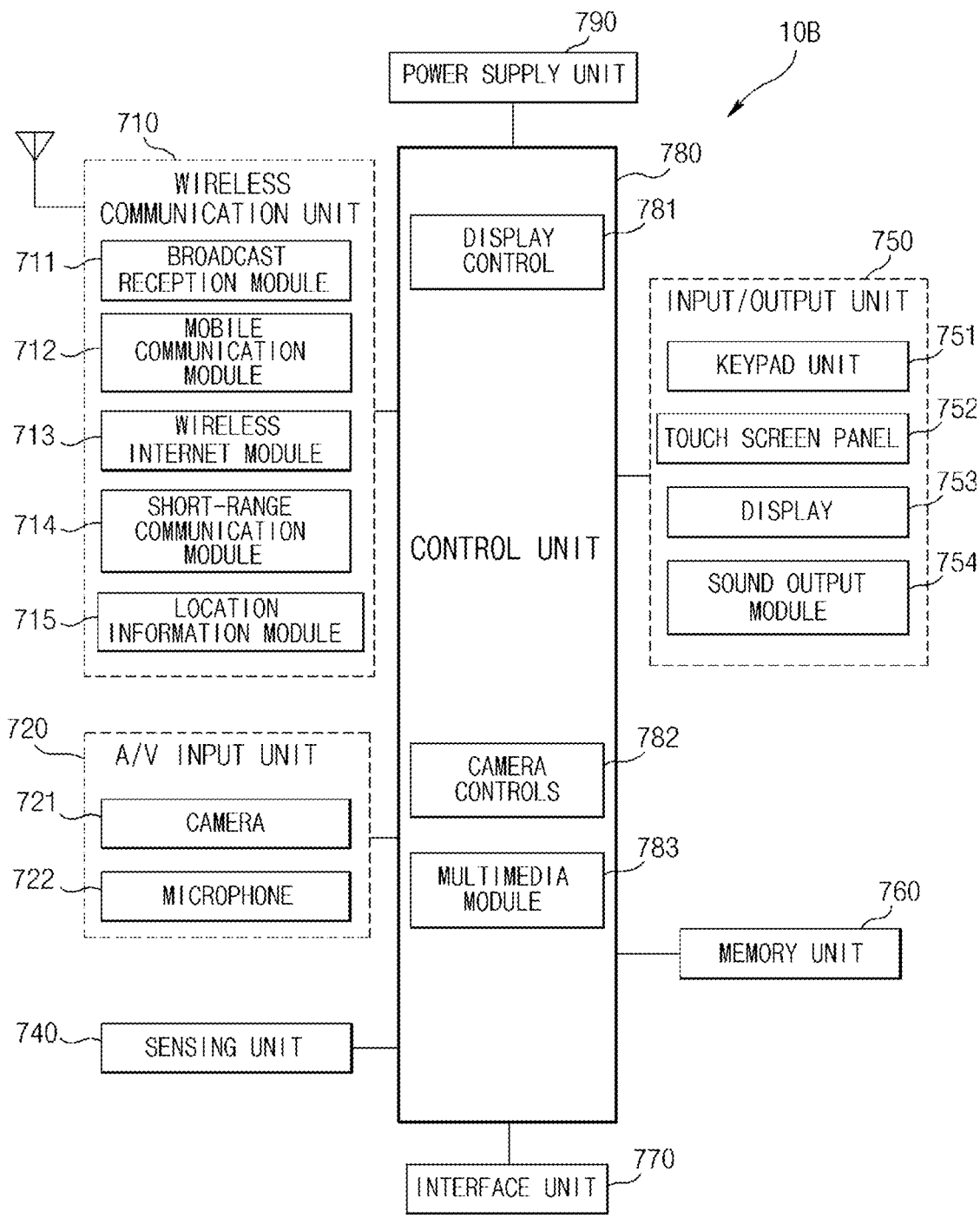

CAMERA DEVICE

CROSS-REFERENCE TO RELATED APPLICATIONS

This application is the U.S. national stage application of International Patent Application No. PCT/KR2020/003644, filed Mar. 17, 2020, which claims the benefit under 35 U.S.C. § 119 of Korean Application No. 10-2019-0035662, filed Mar. 28, 2019, the disclosures of each of which are incorporated herein by reference in their entirety.

DESCRIPTION OF INVENTION

Technical Field

The present embodiment relates to a camera device.

Background Art

As various portable terminals are widely spread and commonly used, and the wireless Internet services have been commercialized, the demands of consumer related to portable terminals have been diversified and various kinds of additional devices have been installed in portable terminals.

Among them, there is a camera device for photographing a subject as a photograph or a moving picture. Meanwhile, a camera device in recent years has been applied with a hand shake correction function that inhibits an image from being shaken due to hand shake of a photographer.

However, the conventional OIS structure of the camera module tilt method is a two-axis hand shake correction method for yawing/pitching that rotates around the X-axis/Y-axis, and there is a disadvantage in that hand shake caused by rolling that rotates around the Z-axis cannot be corrected.

In addition, there is a problem in that the amount of deflection of the posture difference due to gravity occurs in the conventional camera device.

DETAILED DESCRIPTION OF THE INVENTION

Technical Subject

The present embodiment is to provide a camera device capable of 3-axis hand shake correction for yawing, pitching, and rolling, with an OIS structure of a module tilt method.

In addition, it is to provide a camera device that does not cause deflection of a camera module according to a posture difference.

In addition, it is to provide a camera device in which the stress concentration generated in the substrate is dispersed due to the contact support structure.

Technical Solution

The camera device according to the present embodiment comprises: a base; an elastic member disposed on the base and comprising a protrusion; a housing disposed on the base; a camera module comprising a lens and an image sensor and disposed on the protrusion of the elastic member in the housing; a magnet disposed on an outer peripheral surface of the camera module; and a coil disposed in the housing and facing the magnet, wherein the outer peripheral surface of the camera module comprises a first lateral surface and a second lateral surface disposed opposite to each other and a third lateral surface and a fourth lateral surface disposed opposite to each other between the first lateral surface and the second lateral surface, wherein the magnet comprises a first magnet disposed on each of the first lateral surface and the second lateral surface of the camera module in which the polarities of an upper portion and a lower portion of a surface facing the coil are different, and a second magnet disposed on each of the third lateral surface and the fourth lateral surface of the camera module in which the polarities of both lateral portions of a surface facing the coil are different, and wherein the coil may comprise a first coil facing the first magnet, a second coil facing the first magnet and electrically separated from the first coil, and a third coil facing the second magnet and electrically separated from the first coil and the second coil.

The first magnet comprises a first-first magnet disposed on the first lateral surface of the camera module and a first-second magnet disposed on the second lateral surface of the camera module, and the first coil may comprise a first-first coil facing the first-first magnet and a first-second coil facing the first-second magnet.

The second coil may comprise a second-first coil facing the first-first magnet and disposed on one side of the first-first coil, a second-second coil facing the first-first magnet and disposed on the other side of the first-first coil, a second-third coil facing the first-second magnet and disposed on one side of the first-second coil, and a second-fourth coil facing the first-second magnets and disposed on the other side of the first-second coil.

The second magnet comprises a second-first magnet disposed on the third lateral surface of the camera module and a second-second magnet disposed on the fourth lateral surface of the camera module, wherein the third coil may comprise a third-first coil facing the second-first magnet and a third-second coil facing the second-second magnet.

The camera device may further comprise a holder having at least a portion thereof being disposed inside the housing and coupled to the camera module, an upper elastic member having a portion thereof being coupled to the holder, and a wire connecting the upper elastic member and the base.

The camera device further comprises a first substrate disposed on an outer surface of the housing, wherein the coil may be coupled to an inner surface of the first substrate.

The camera module comprises a second substrate on which the image sensor is disposed and a flexible third substrate coupled to the second substrate, wherein the third substrate may comprise an inner portion comprising a terminal connected to a terminal disposed on a lower surface of the second substrate, an outer portion fixed to the base and comprising a terminal, and a connection portion that connects the inner portion and the outer portion and is bent at least in portion.

The camera module may comprise a cover comprising an upper plate and a lateral plate extending from the upper plate, a bobbin disposed inside the cover and coupled to the lens, a coil disposed on the bobbin, a magnet disposed between the coil of the camera module and the lateral plate of the cover, and an elastic member coupled to the bobbin.

The lens of the camera module may comprise a plurality of lenses, and the camera module may comprise a liquid lens disposed between the plurality of lenses.

The camera device according to the present embodiment comprises a base, an elastic member disposed on the base and comprising a protrusion, a housing disposed on the base, a camera module comprising a lens and an image sensor and disposed on the protrusion of the elastic member inside the housing, a magnet disposed on an outer peripheral surface of the camera module, and a coil disposed in the housing and facing the magnet, wherein the coil may comprise a first coil for rotating the camera module about a first axis perpendicular to the optical axis through interaction with the magnet, a second coil for rotating the camera module about a second axis perpendicular to the optical axis and the first axis through interaction with the magnet, and a third coil for rotating the camera module about the optical axis through interaction with the magnet.

The camera device according to the present embodiment comprises a camera module, a magnet disposed on the camera module, and a coil facing the magnet, wherein the camera module comprises a first lateral surface and a second lateral surface disposed opposite to each other, a third lateral surface and a fourth lateral surface disposed opposite to each other between the first lateral surface and the second lateral surface, wherein the magnet comprises a first magnet disposed on each of the first lateral surface and the second lateral surface of the camera module, a second magnet disposed on each of the third lateral surface and the fourth lateral surface of the camera module, wherein the polarities of an upper portion and a lower portion of the first magnet are different, and the polarities of the both lateral portions of the second magnet are different, and wherein the coil may comprise three coils facing the first magnet and one coil facing the second magnet.

Advantageous Effects

Through the present embodiment, enhanced hand shake correction (OIS) function can be provided by performing 3-axis hand shake correction of yawing, pitching, and rolling with a module tilt method.

In addition, since deflection of the camera module according to the posture difference does not occur, the control for hand shake correction becomes simpler and more precise hand shake correction can be performed in all postures.

In addition, the occurrence of stress concentration at a specific point of the substrate is inhibited, so that damage to the substrate and the image sensor mounted on the substrate due to a drop impact and the like can be inhibited.

BRIEF DESCRIPTION OF DRAWINGS

FIG. 16(*d*) is a view for explaining the yawing driving to the other side of the camera module in the camera device according to the present embodiment, FIG. 16(*e*) is a view for explaining the pitching driving to the other side of the camera module, and FIG. 16(*f*) is a view for explaining the rolling driving to the other side of the camera module.

FIG. 22 is a block diagram of an optical apparatus illustrated in FIG. 21.

BEST MODE

Figure 1:
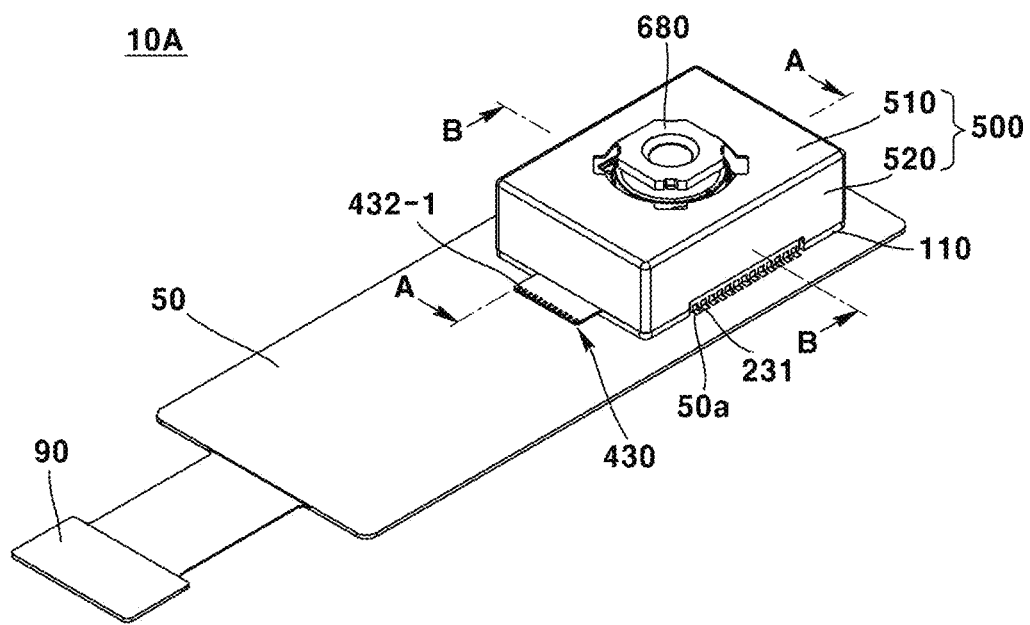
FIG. 1 is a perspective view of a camera device according to the present embodiment.

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (comprising technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may comprise the plural form unless specifically stated in the phrase, and when described as "at least one (or more than one) of A and B and C", it may comprise one or more of all combinations that can be combined with A, B, and C In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also comprise cases of being 'connected', 'coupled', or 'interconnected' due that another component between that other components.

In addition, when described as being formed or arranged in "on (above)" or "below (under)" of each component, "on (above)" or "below (under)" means that it comprises not only the case where the two components are directly in contact with, but also the case where one or more other components are formed or arranged between the two components. In addition, when expressed as "on (above)" or "below (under)", the meaning of not only an upward direction but also a downward direction based on one component may be comprised.

An 'optical axis (refer to OA of FIG. 7) direction' used hereinafter is defined as an optical axis direction of a lens and/or an image sensor coupled to the lens driving device.

The 'vertical direction' used hereinafter may be a direction parallel to the optical axis direction. The vertical direction may correspond to the 'z-axis direction (refer to FIG. 7)'. The 'horizontal direction' used below may be a direction perpendicular to the vertical direction. That is, the horizontal direction may be a direction perpendicular to the optical axis. Accordingly, the horizontal direction may comprise an 'x-axis direction' and a 'y-axis direction' (refer to FIG. 7).

The 'autofocus function' used hereinafter is defined as a function of automatically focusing on the subject by adjusting the distance from the image sensor by moving the lens in the optical axis direction according to the distance of the subject so that a clear image of the subject can be obtained on the image sensor. Meanwhile, 'auto focus' may correspond to 'AF (Auto Focus)'.

A 'hand shake correction function' used hereinafter is defined as a function of moving a lens and/or an image sensor to offset vibration (movement) generated in the image sensor by an external force. Meanwhile, 'hand shake correction' may correspond to 'optical image stabilization (OIS)'.

'Yawing' used hereinafter may be a movement in a yaw direction that rotates about a y-axis (refer to FIGS. 16(a)-16(d)). 'Pitching' used hereinafter may be a movement in a pitch direction rotating around the x-axis (see FIGS. 16(a)-16(c) and 16(e)). 'Rolling' used hereinafter may be a movement in a roll direction rotating around the z-axis (see FIGS. 16(a)-16(c) and 16(f)).

Hereinafter, the configuration of the camera device will be described with reference to the drawings.

Figure 2:
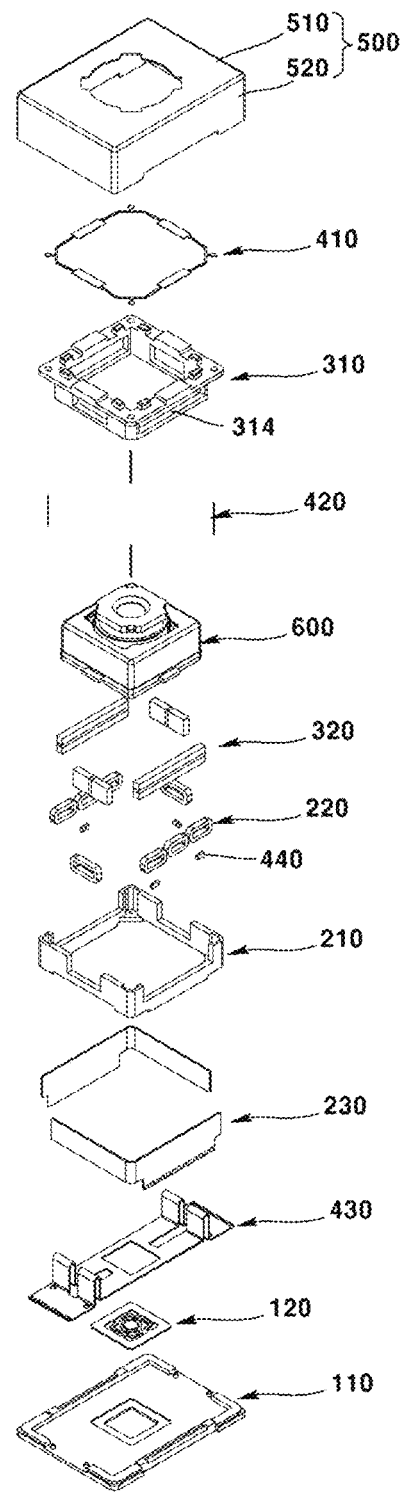
FIG. 2 is an exploded perspective view of the camera device according to the present embodiment.
Figure 3:
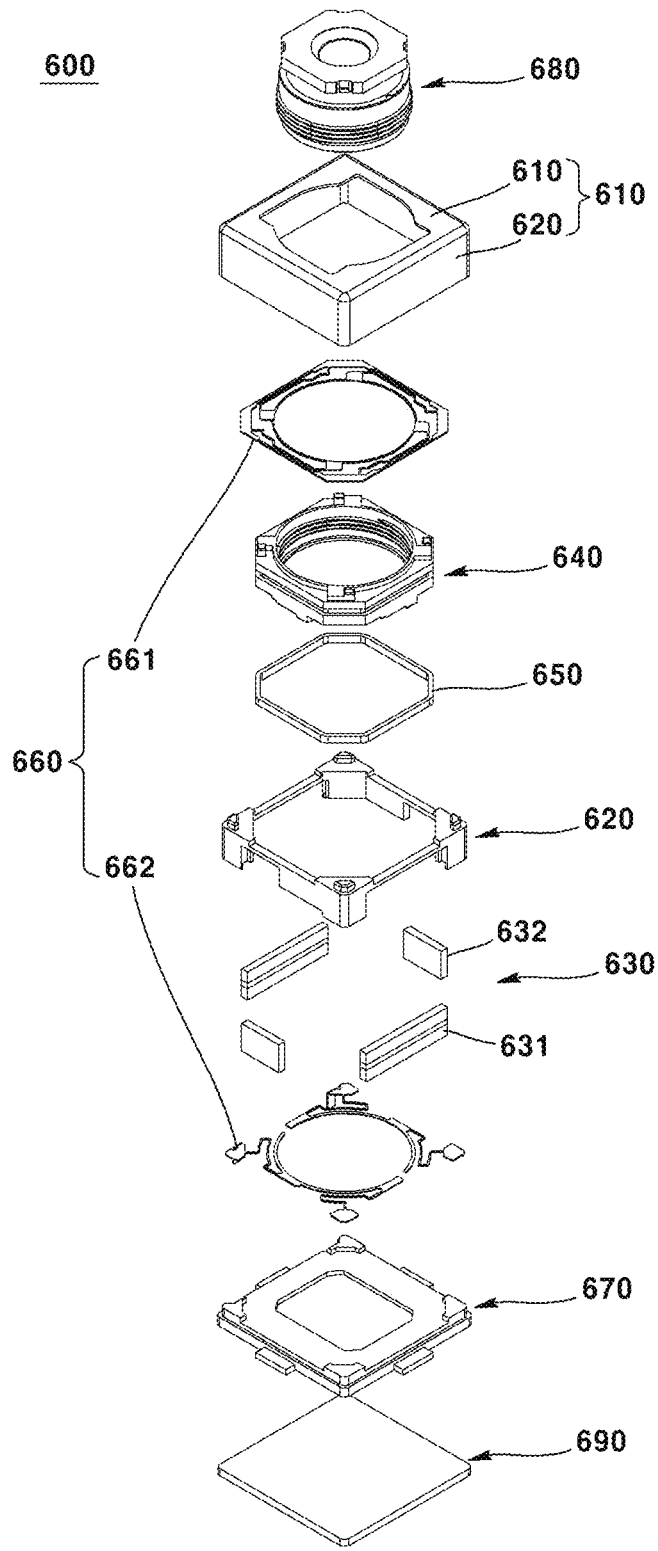
FIG. 3 is an exploded perspective view of the camera module according to the present embodiment.
Figure 4:
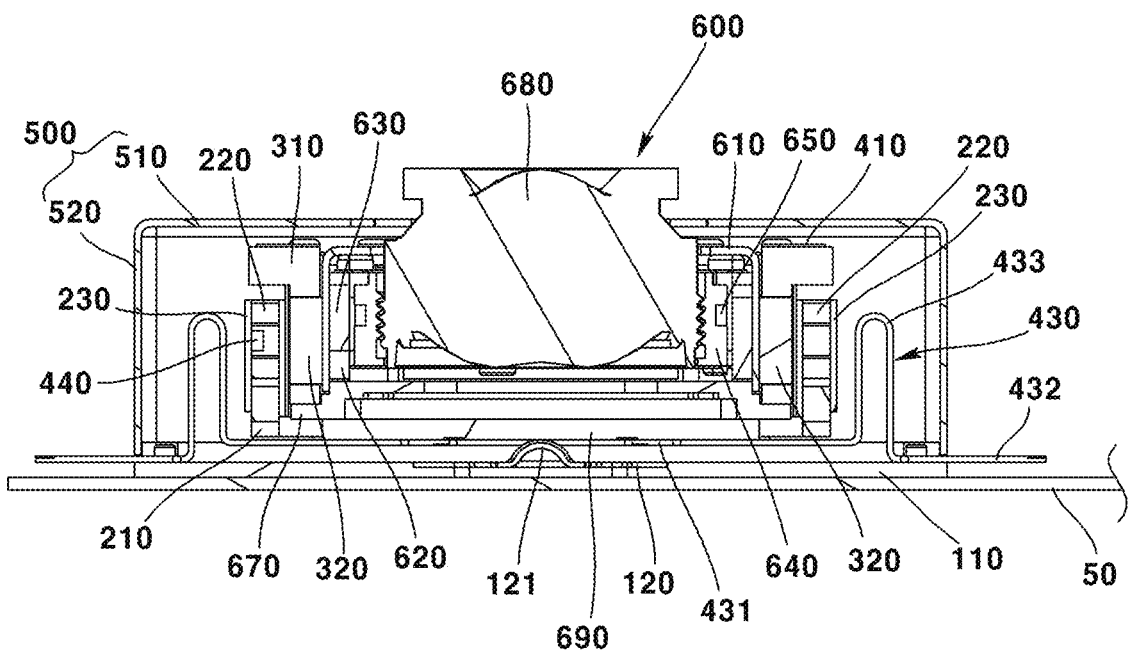
FIG. 4 is a cross-sectional view viewed from A-A of FIG. 1.
Figure 5:
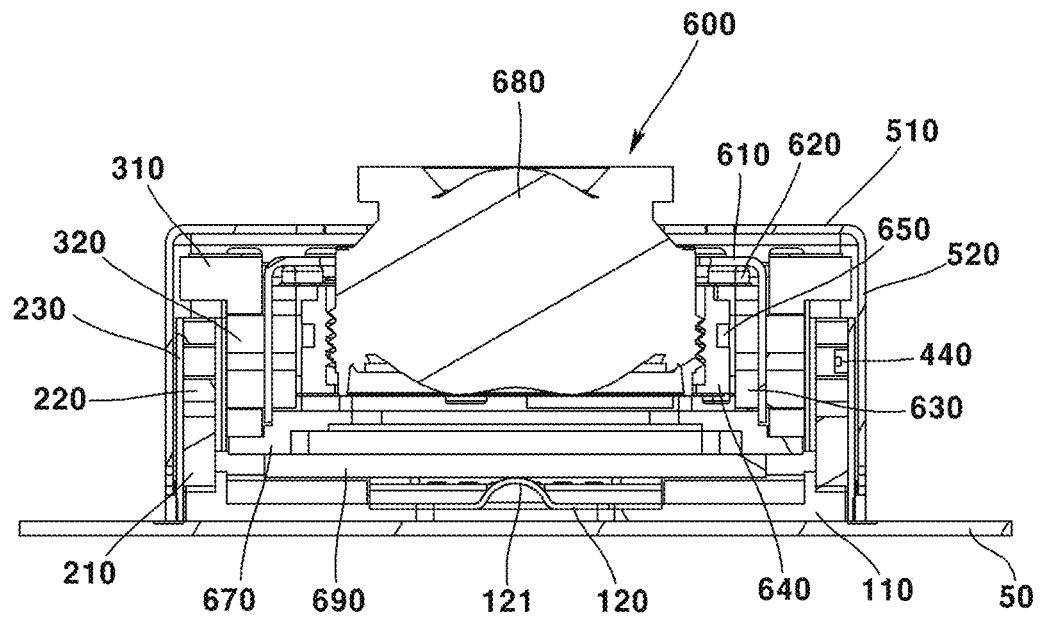
FIG. 5 is a cross-sectional view viewed from B-B of FIG. 1.
Figure 6:
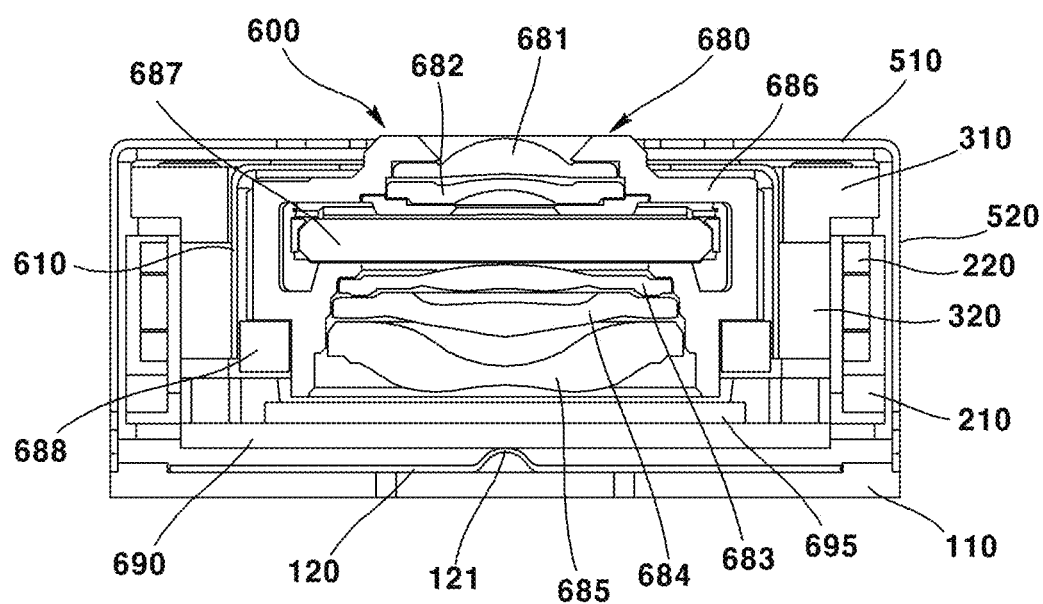
FIG. 6 is a cross-sectional view of a camera device according to a modified example.
Figure 7:
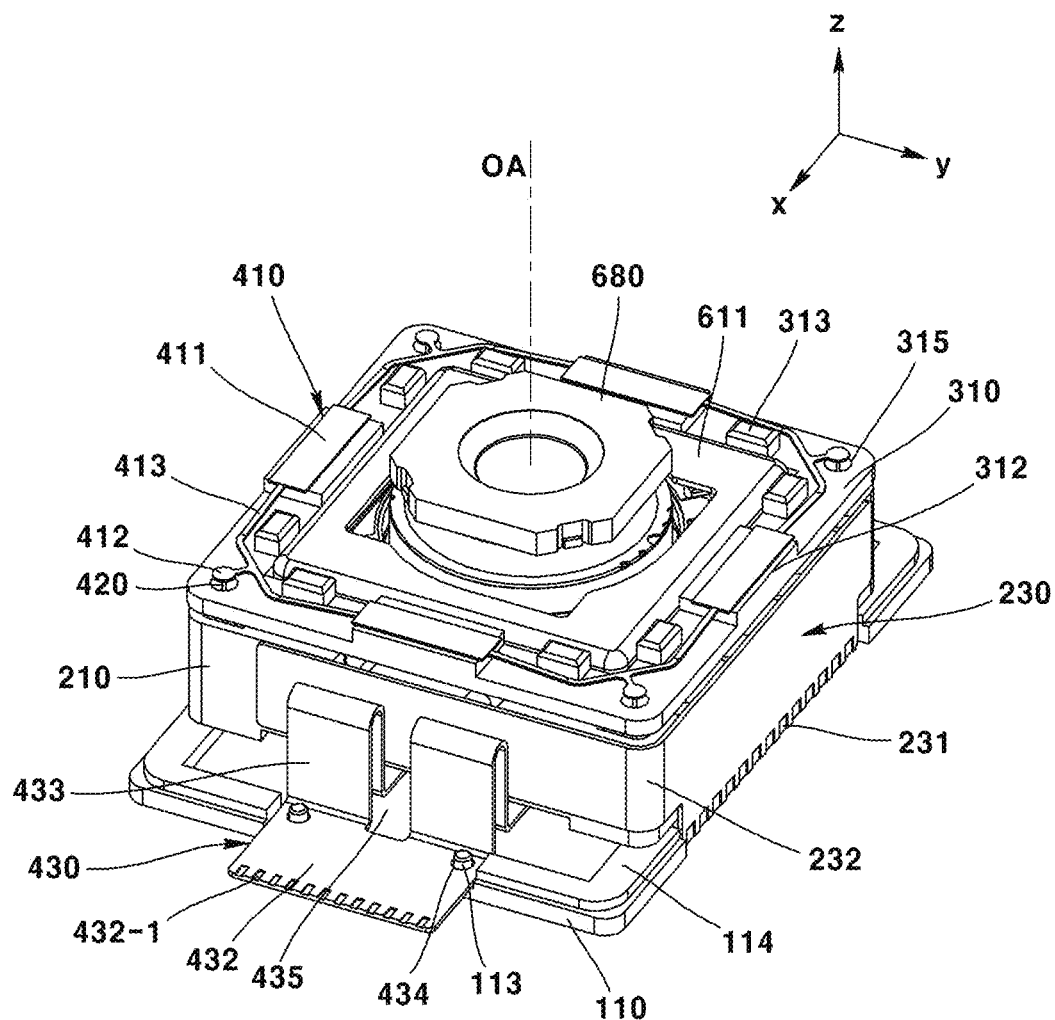
FIG. 7 is a perspective view of a partial configuration of the camera device according to the present embodiment.
Figure 8:
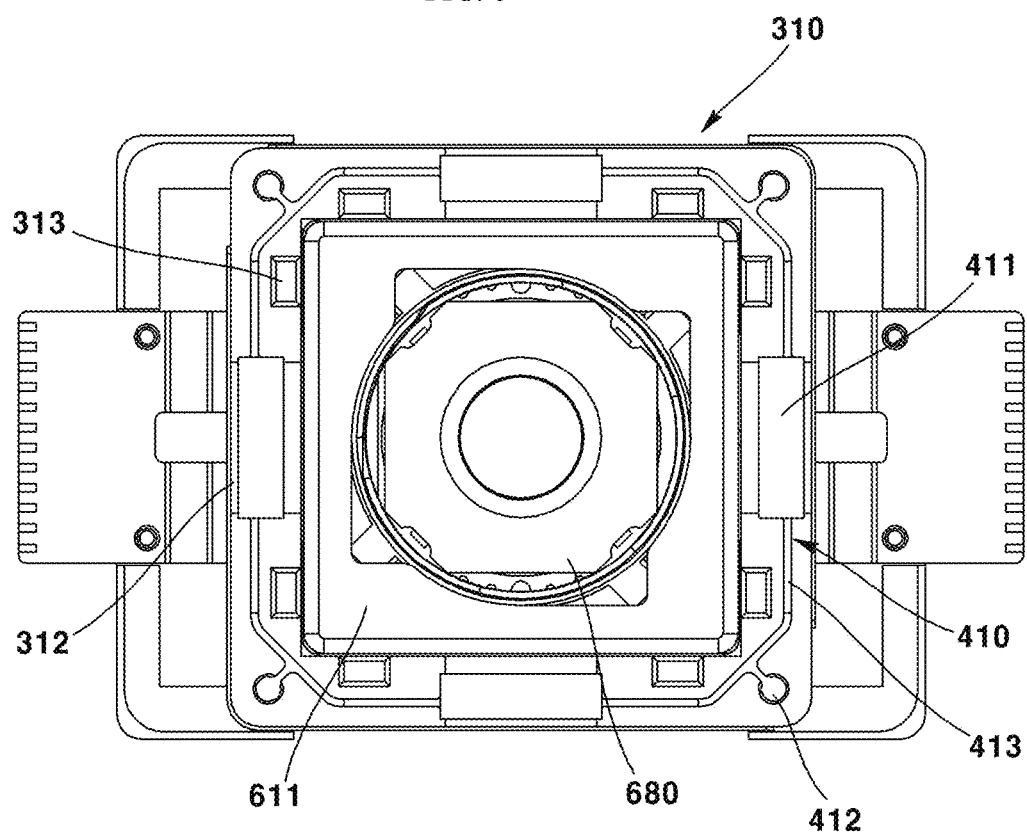
FIG. 8 is a plan view of a partial configuration of the camera device according to the present embodiment.
Figure 9:
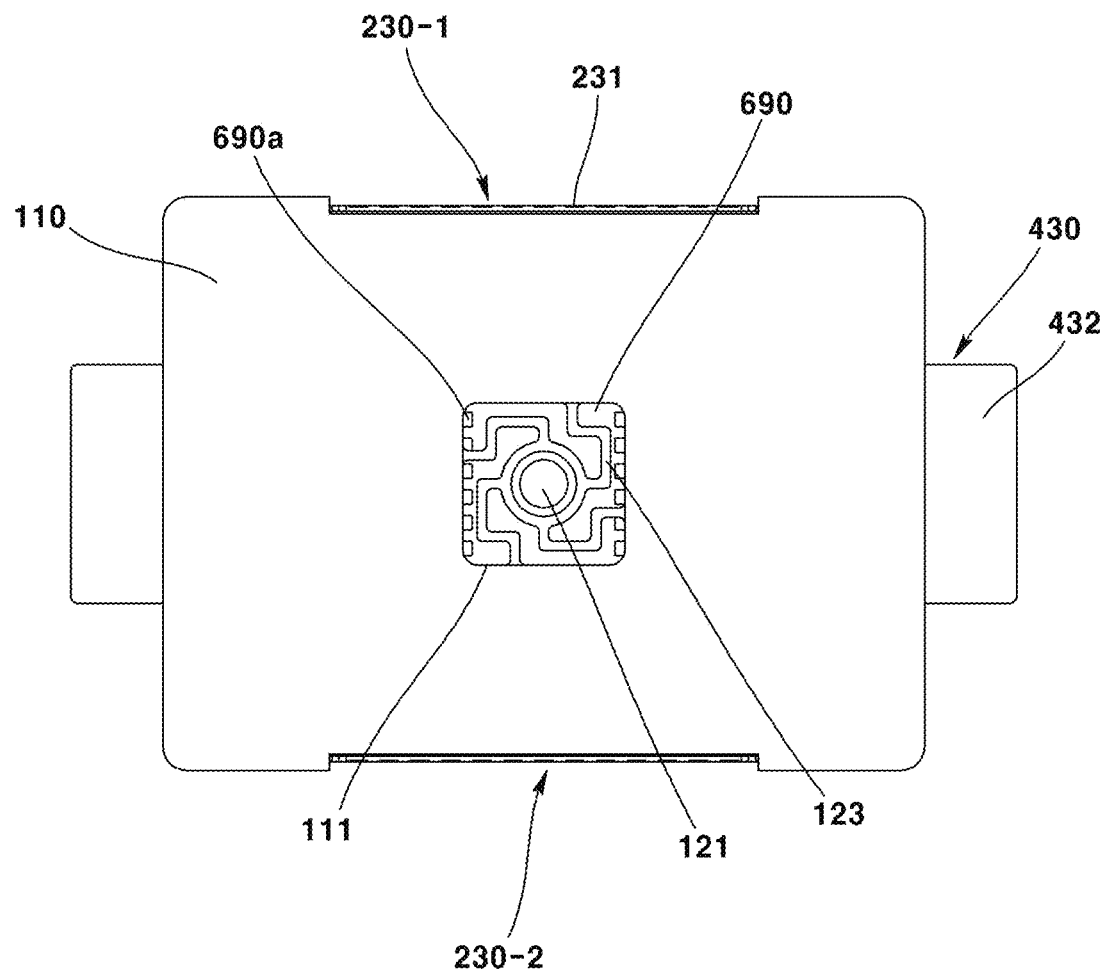
FIG. 9 is a bottom view of a partial configuration of the camera device according to the present embodiment.
Figure 10:
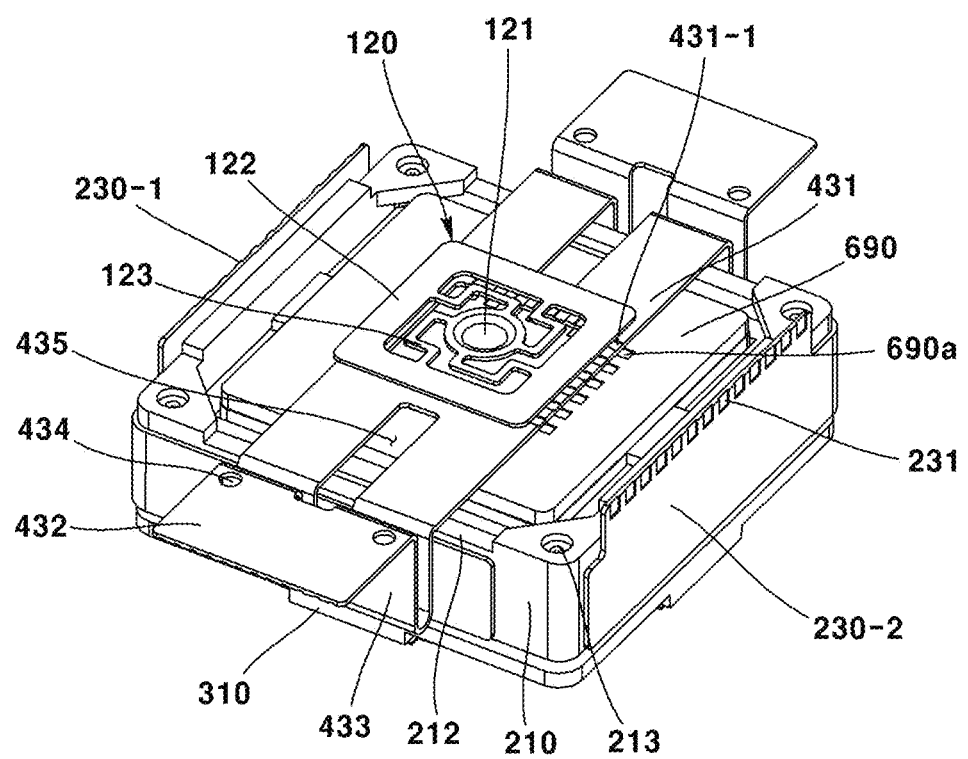
FIG. 10 is a bottom perspective view of a partial configuration of the camera device according to the present embodiment.
Figure 11:
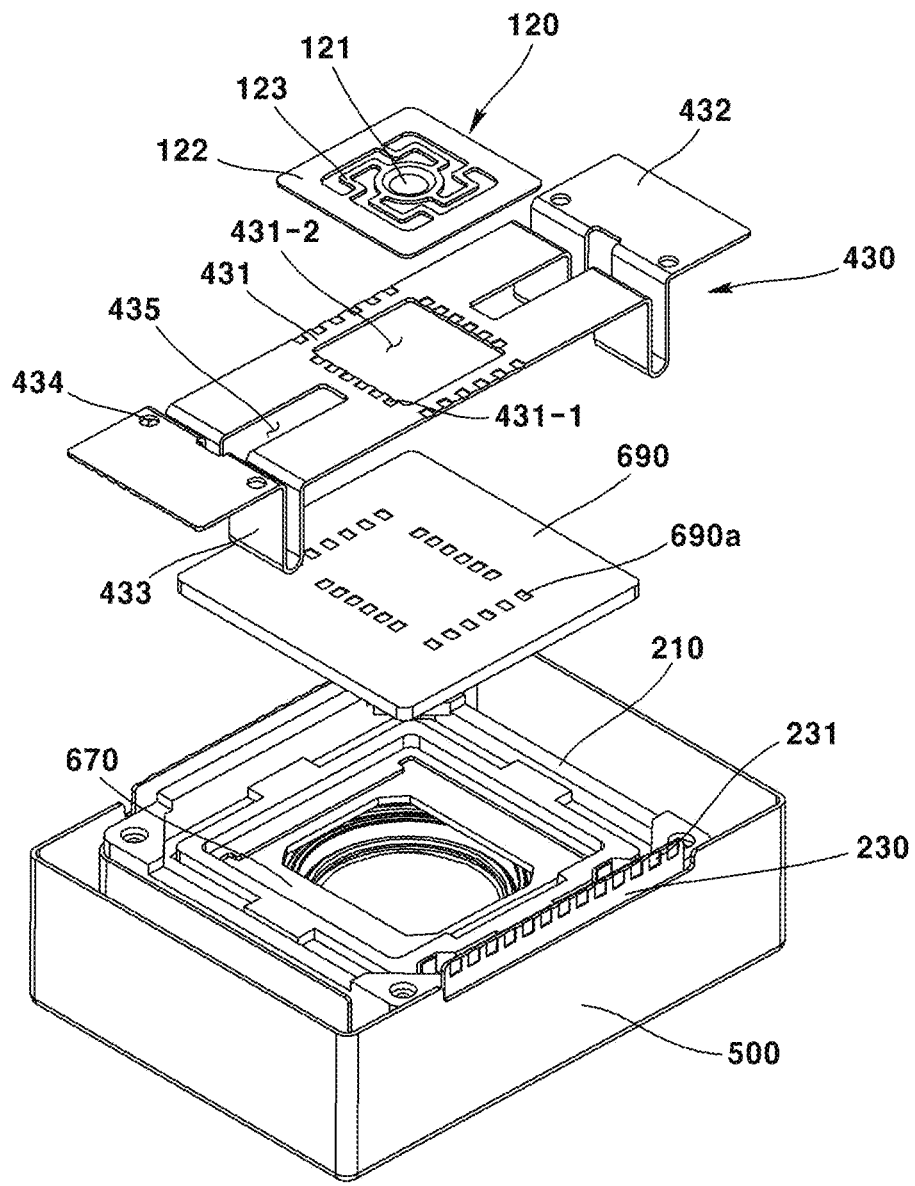
FIG. 11 is an exploded perspective view a partial configuration of the camera device of FIG. 10.
Figure 12:
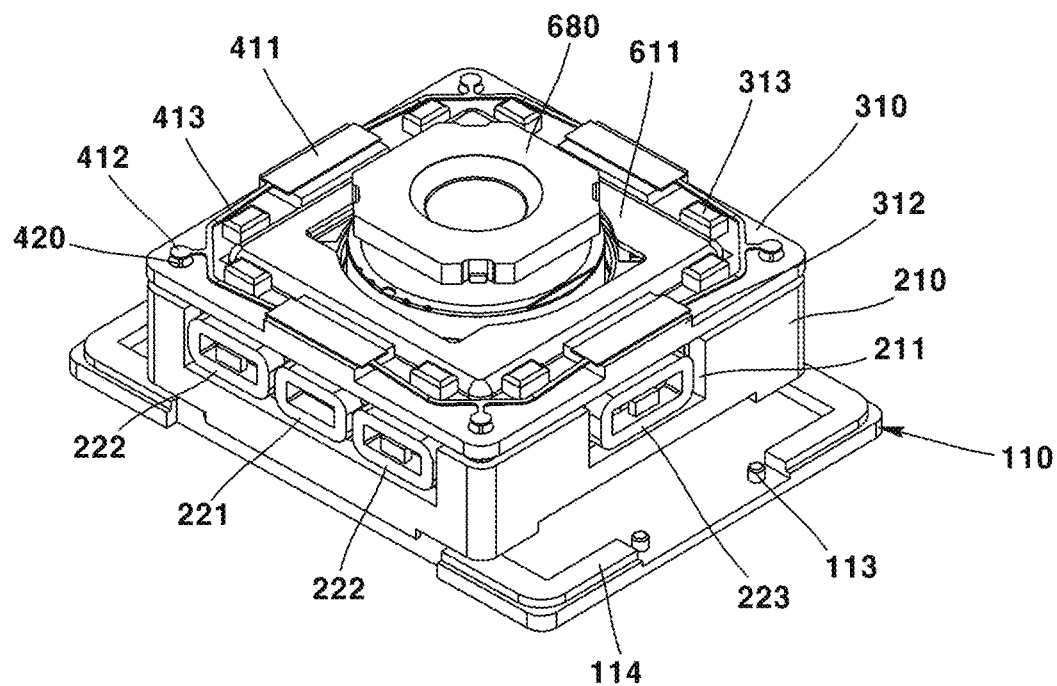
FIG. 12 is a perspective view of a partial configuration of the camera device according to the present embodiment.
Figure 13:
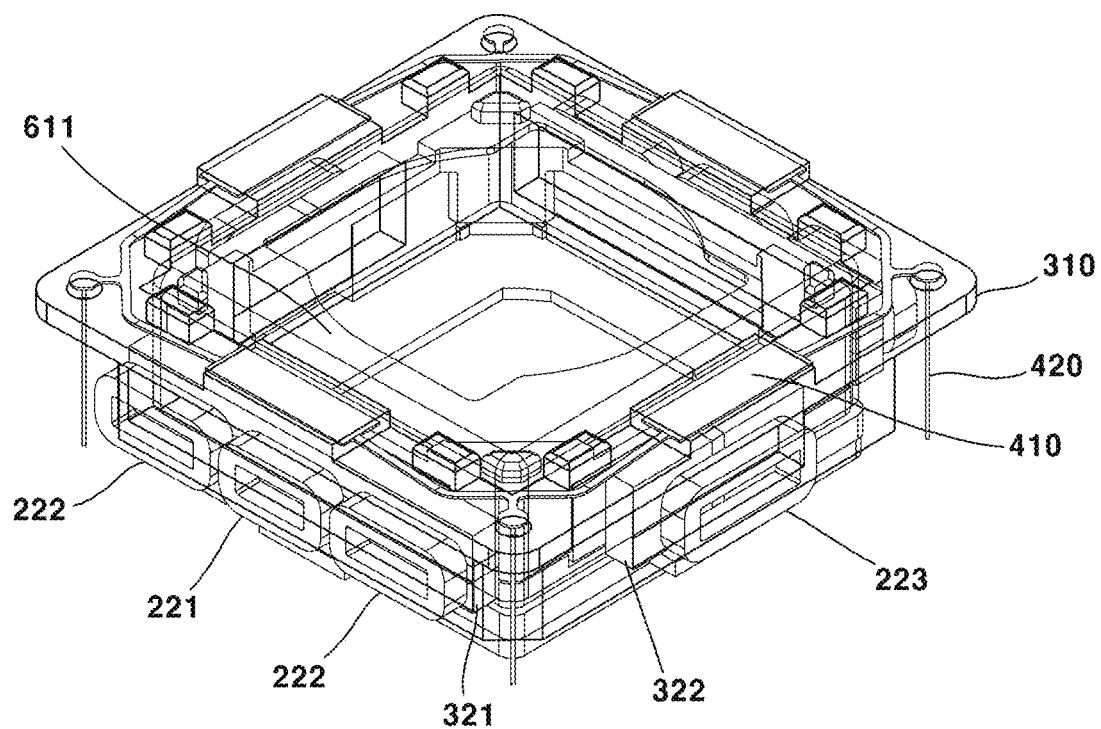
FIG. 13 is a see-through view of a partial configuration of the camera device according to the present embodiment.
Figure 14:
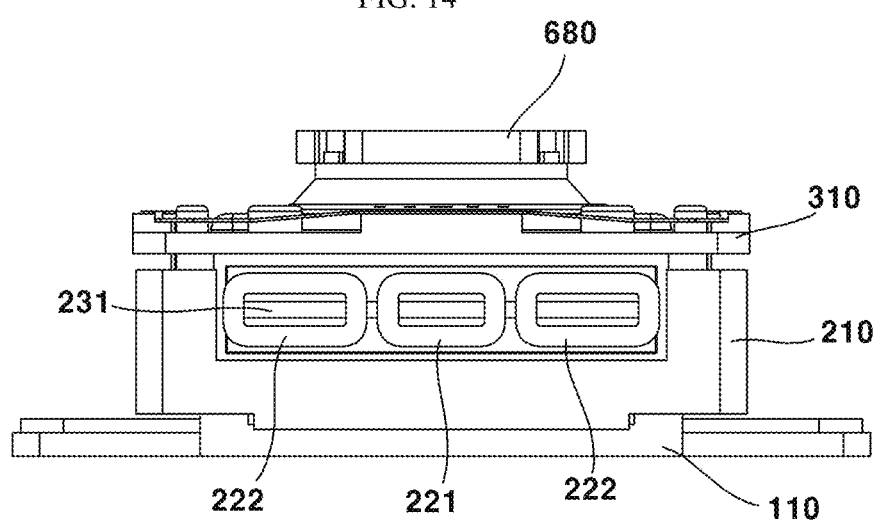
FIG. 14 is a side view of a partial configuration of the camera device according to the present embodiment.
Figure 15:
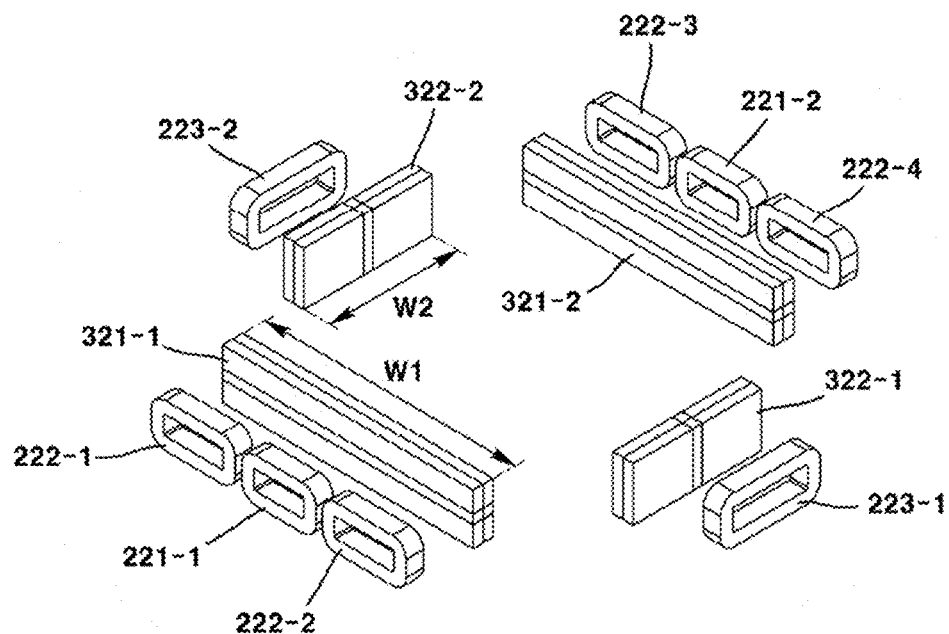
FIG. 15 is a perspective view illustrating a magnet and a coil of the camera device according to the present embodiment.
Figure 16A:
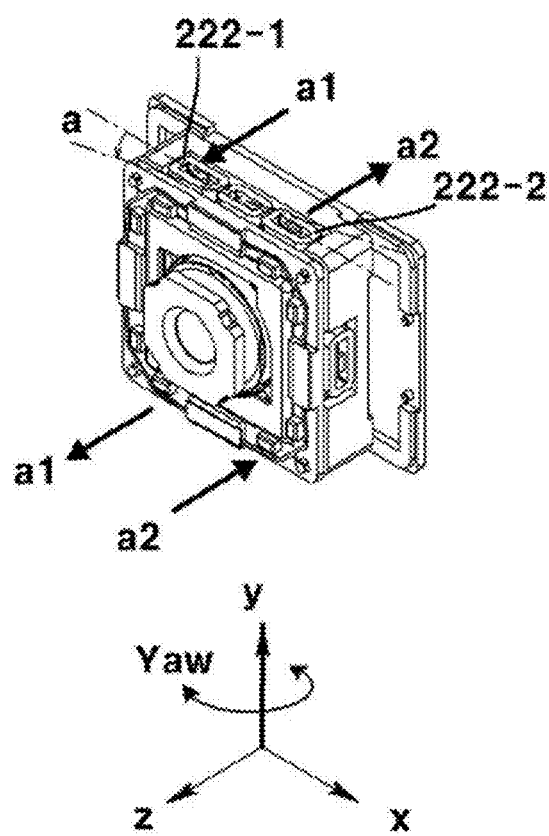
FIG. 16(*a*) is a view for explaining the yawing driving to one side of the camera module in the camera device according to the present embodiment, FIG. 16(*b*) is a diagram for explaining the pitching driving to one side of the camera module, and FIG. 16(*c*) is a view for explaining the rolling driving to one side of the camera module.
Figure 16B:
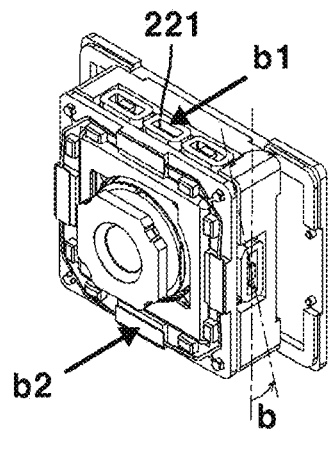
Figure 16B:
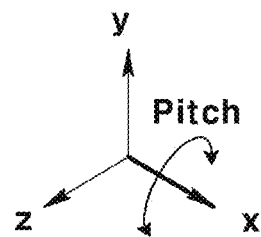
Figure 16C:
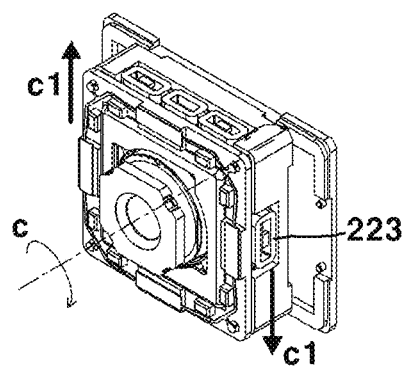
Figure 16C:
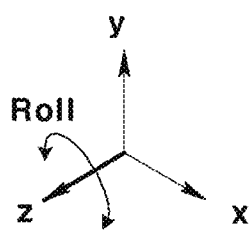
Figure 16D:
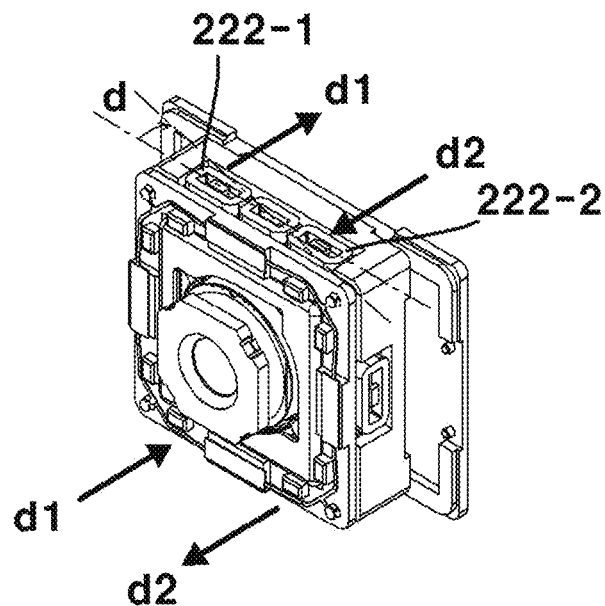
Figure 16E:
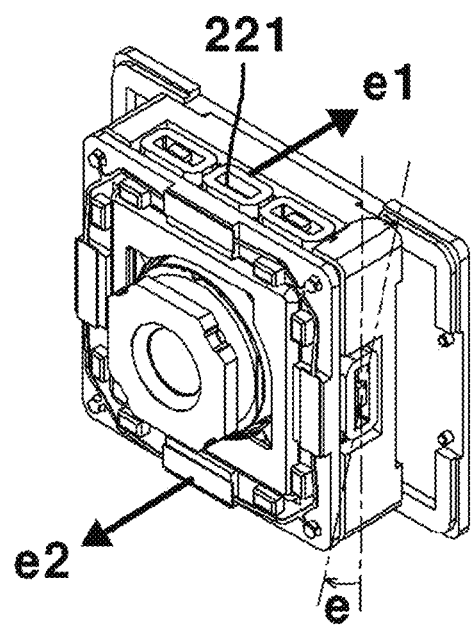
Figure 16F:
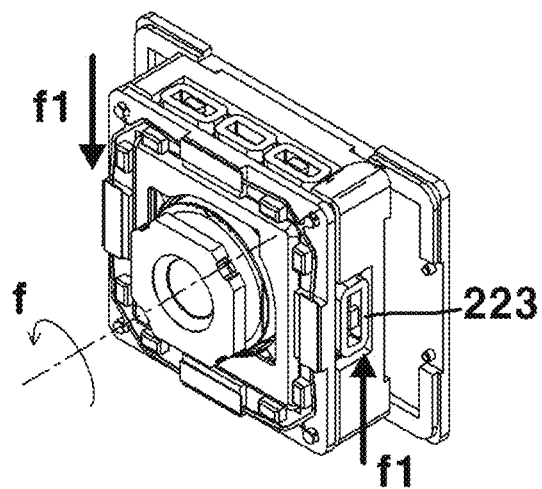
Figure 17:
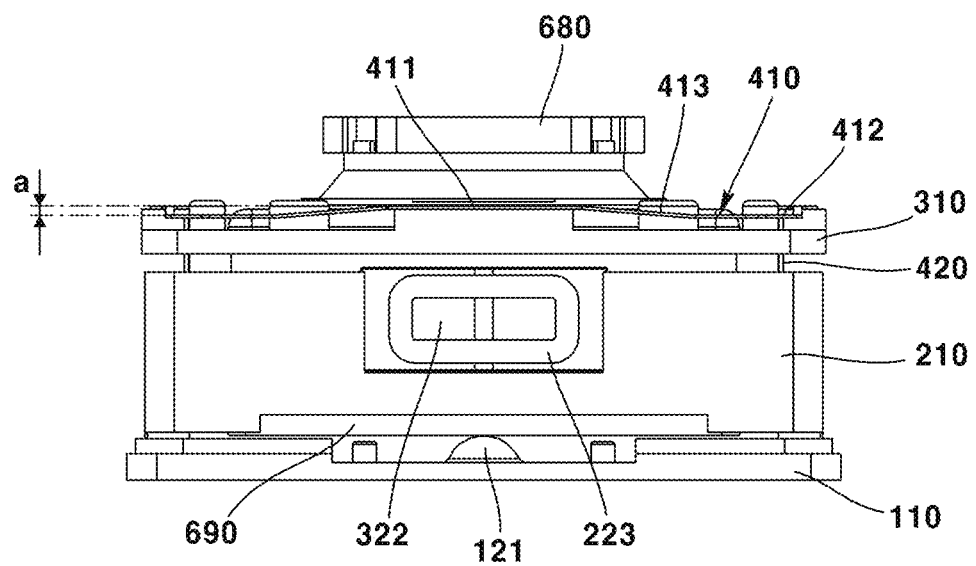
FIG. 17 is a side view of a partial configuration of the camera device according to the present embodiment viewed from a different direction than FIG. 14.
Figure 18A:
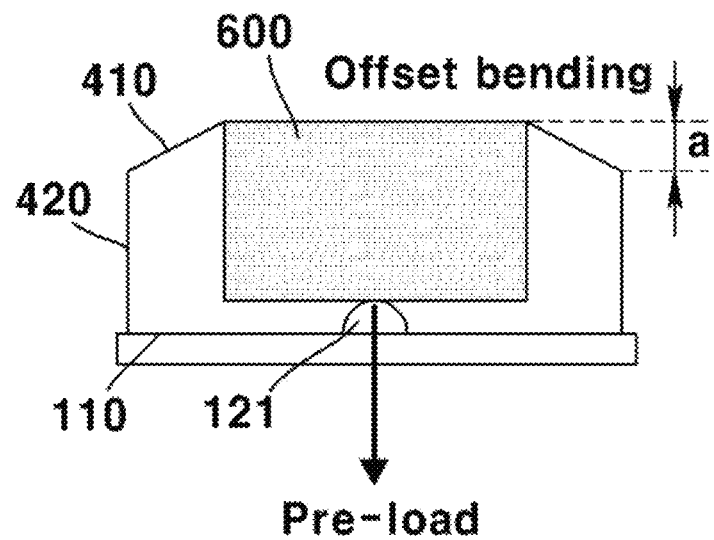
FIG. 18 (*a*) is a diagram for explaining the pre-load generated on the elastic member in the posture of the camera module looking upward, FIG. 18 (*b*) is a diagram for explaining the pre-load generated on the elastic member in the posture of the camera module looking down, and FIG. 18 (*c*) is a diagram for explaining the pre-load generated on the elastic member in a posture of the camera module looking side.
Figure 18B:
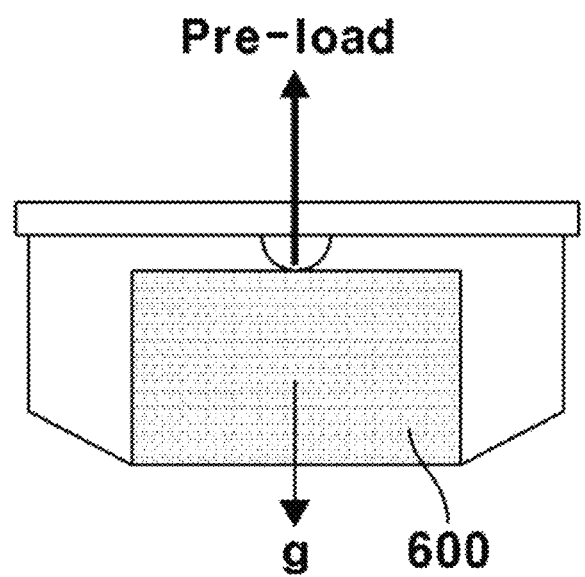
Figure 18C:
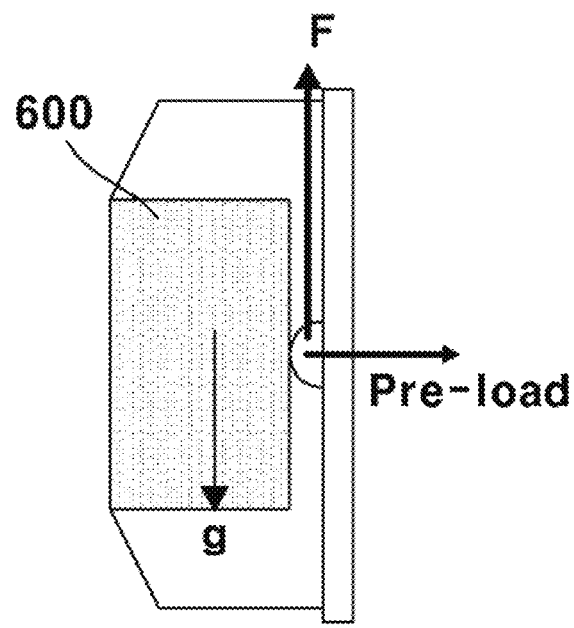
Figure 19:
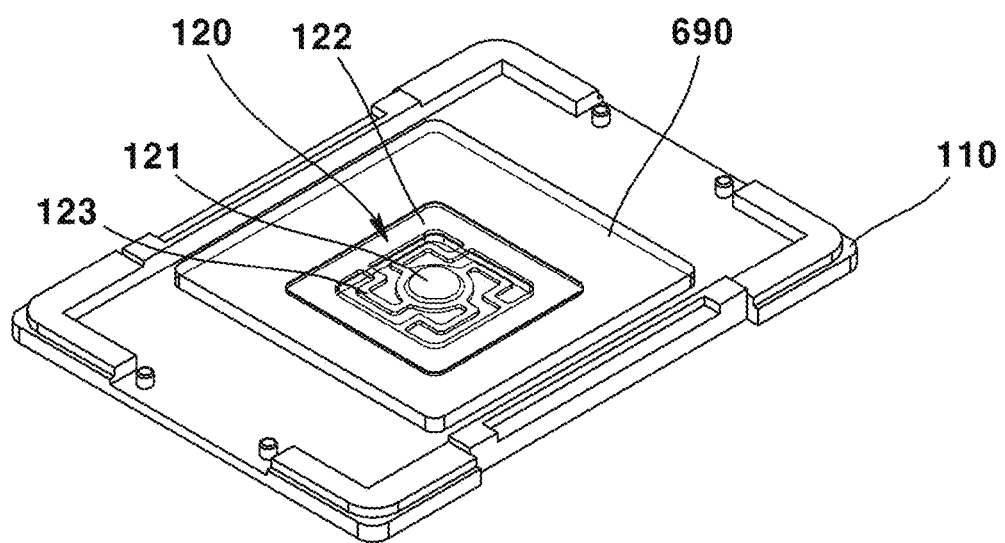
FIG. 19 is a perspective view of a partial configuration of the camera device according to the present embodiment.
Figure 20A:
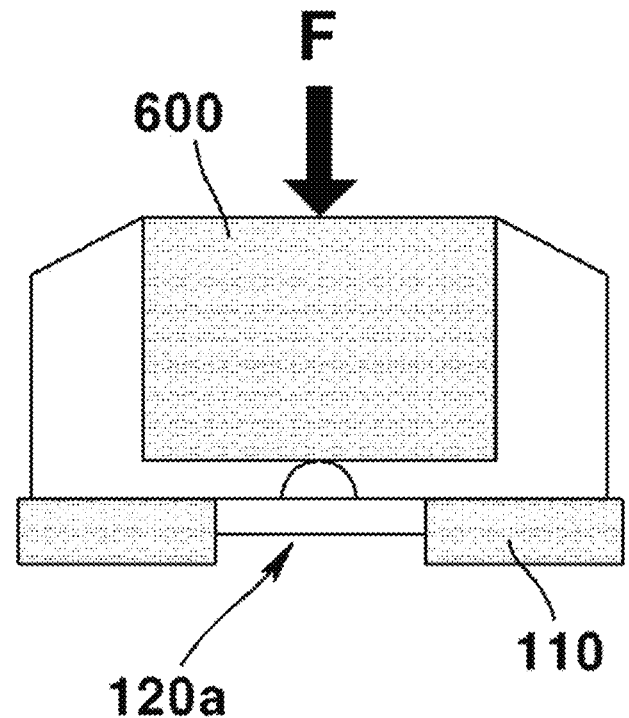
FIG. 20 (*a*) is a view for explaining the drop impact acting on the camera module in a comparative example, and FIG. 20 (*b*) is a view for explaining a drop impact acting on the camera module in the camera device according to the present embodiment.
Figure 20B:
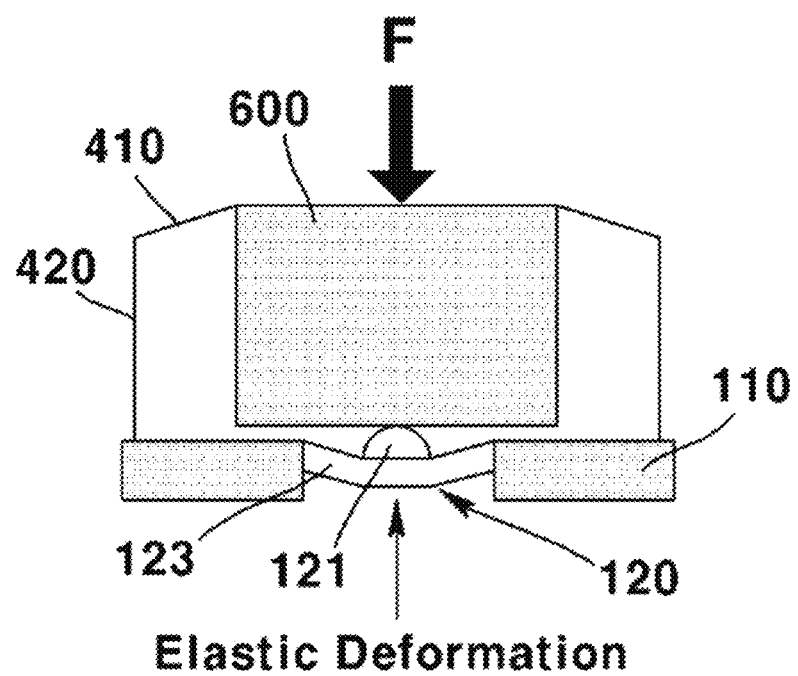

FIG. 1 is a perspective view of a camera device according to the present embodiment, FIG. 2 is an exploded perspective view of the camera device according to the present embodiment, FIG. 3 is an exploded perspective view of the camera module according to the present embodiment, FIG. 4 is a cross-sectional view viewed from A-A of FIG. 1, FIG. 5 is a cross-sectional view viewed from B-B of FIG. 1, FIG. 6 is a cross-sectional view of a camera device according to a modified example, FIG. 7 is a perspective view of a partial configuration of the camera device according to the present embodiment, FIG. 8 is a plan view of a partial configuration of the camera device according to the present embodiment, FIG. 9 is a bottom view of a partial configuration of the camera device according to the present embodiment, FIG. 10 is a bottom perspective view of a partial configuration of the camera device according to the present embodiment, FIG. 11 is an exploded perspective view a partial configuration of the camera device of FIG. 10, FIG. 12 is a perspective view of a partial configuration of the camera device according to the present embodiment, FIG. 13 is a see-through view of a partial configuration of the camera device according to the present embodiment, FIG. 14 is a side view of a partial configuration of the camera device according to the present embodiment, FIG. 15 is a perspective view illustrating a magnet and a coil of the camera device according to the present embodiment, FIG. 16a (a) is a view for explaining the yawing driving to one side of the camera module in the camera device according to the present embodiment, FIG. 16(b) is a diagram for explaining the pitching driving to one side of the camera module, FIG. 16(c) is a view for explaining the rolling driving to one side of the camera module, FIG. 16(d) is a view for explaining the yawing driving to the other side of the camera module in the camera device according to the present embodiment, FIG. 16(e) is a view for explaining the pitching driving to the other side of the camera module, FIG. 16(f) is a view for explaining the rolling driving to the other side of the camera module, FIG. 17 is a side view of a partial configuration of the camera device according to the present embodiment viewed from a different direction than FIG. 14, FIG. 18(a) is a diagram for explaining the pre-load generated on the elastic member in the posture of the camera module looking upward, FIG. 18 (b) is a diagram for explaining the pre-load generated on the elastic member in the posture of the camera module looking down, FIG. 18 (c) is a diagram for explaining the pre-load generated on the elastic member in a posture of the camera module looking side, FIG. 19 is a perspective view of a partial configuration of the camera device according to the present embodiment, and FIG. 20 (a) is a view for explaining the drop impact acting on the camera module in a comparative example, and FIG. 20 (b) is a view for explaining a drop impact acting on the camera module in the camera device according to the present embodiment.

The camera device 10A may comprise a camera module. The camera device 10A may comprise a lens driving device. The lens driving device may be a voice coil motor (VCM). The lens driving device may be a lens driving motor. The lens driving device may be a lens driving actuator. The lens driving device may comprise an AF module. The lens driving device may comprise an OIS module.

The camera device 10A may comprise a base 110. The base 110 may be disposed on a printed circuit board 50. The base 110 may be disposed on the printed circuit board 50. The base 110 may be disposed on an upper surface of the printed circuit board 50. The base 110 may be disposed between a housing 210 and the printed circuit board 50. The base 110 may be coupled to a lateral plate 520 of a cover 500.

The base 110 may comprise a hole 111. The hole 111 may be a hollow hole. The hole 111 may be an opening. The hole 111 may be formed to penetrate through the base 110 in the optical axis direction. The base 110 may comprise a groove 112. The groove 112 may be formed on an upper surface of the base 110. The groove 112 may be formed around the hole 111. An elastic member 120 may be disposed in the groove 112. The depth of the groove 112 may be lower than the height of a protrusion 121 of the elastic member 120. Through this, the protrusion 121 of the elastic member 120 disposed in the groove 112 may be protruded from an upper surface of the base 110.

The base 110 may comprise a protrusion 113. The protrusion 113 may be formed on an upper surface of the base 110. The protrusion 113 may be inserted into a first hole 434 of a third substrate 430. The protrusion 113 may fix a portion of the third substrate 430 to the base 110. The protrusion 113 may comprise a plurality of protrusions. Two protrusions 113 may be provided adjacent to one side of the base 110, and two protrusions 113 may be provided adjacent to the other side of the base 110.

The base 110 may comprise a guide wall 114. The guide wall 114 may be formed to be protruded from an upper surface of the base 110. The guide wall 114 may be formed to be spaced apart from an outer circumference of the base 110. The separation distance between the guide wall 114 and the outer circumference of the base 110 may correspond to the thickness of the lateral plate 520 of the cover 500. That is, the lateral plate 520 of the cover 500 may be disposed on an upper surface of the base 110 between the guide wall 114 and the outer circumference of the base 110. The guide wall 114 may serve as an assembly guide for the lateral plate 520 of the cover 500, while supporting the inner surface of the lateral plate 520 of the assembled cover 500. Furthermore, the lateral plate 520 of the cover 500 may be fixed to an upper surface of the guide wall 114 and/or the base 110 through an adhesive.

The camera device 10A may comprise an elastic member 120. The elastic member 120 may be disposed on the base 110. The elastic member 120 may elastically support the camera module 600. The elastic member 120 may be disposed between the camera module 600 and the base 110. The elastic member 120 may have elasticity at least in part. The elastic member 120 may be formed of metal. The elastic member 120 may comprise a plate spring.

As illustrated in FIGS. 19 and 20 (*a*)-20 (*b*), an elastic member 120 having a shock-relieving spring structure can be applied to the contact support structure in order to disperse the stress concentration in a second substrate 690 due to the contact support structure of the lower surface of the camera module 600. That is, the elastic member 120 may relieve stress concentration at a specific point of the second substrate 690 in the pre-load structure through the upper elastic member 410. In this embodiment, a shock-reducing spring structure is applied to the support structure of the camera module 600 to disperse the stress concentration applied to the second substrate 690 in the case of a drop impact so that there is an effect of inhibiting damage to the image sensor 695. As illustrated in FIG. 20 (*b*), when a drop impact F is applied in this embodiment, the elastic member 120 is elastically deformed, so that the shock generated on the second substrate 690 can be alleviated. In particular, when the elastic deformation of the elastic member 120 of this embodiment is compared with the support member 120*a* of the comparative example of FIG. 20 (*a*), the impact mitigation effect in this embodiment can be confirmed more clearly.

The elastic member 120 may comprise a protrusion 121. The protrusion 121 may provide a pivot center for a pivot movement of the camera module 600. The protrusion 121 may be in contact with a lower surface of the camera module 600. The protrusion 121 may elastically support the camera module 600. The upper end portion of the protrusion 121 may be rounded. The protrusion 121 may comprise a portion having a curvature.

The elastic member 120 may comprise a coupling portion 122. The coupling portion 122 may be disposed on the base 110. The coupling portion 122 may be disposed in the groove 112 of the base 110. The coupling portion 122 may be fixed to the base 110 by an adhesive. The coupling portion 122 may have a rectangular frame shape.

The elastic member 120 may comprise a connection portion 123. The connection portion 123 may connect the protrusion 121 and the coupling portion 122 to each other. The connection portion 123 may have elasticity. The connection portion 123 may elastically connect the coupling portion 122 which is a fixed portion and the protrusion 121 which is a movable portion. The connection portion 123 may comprise a bent or bent portion. The connection portion 123 may comprise a rounded shape.

The camera device 10A may comprise a housing 210. The housing 210 may be disposed on the base 110. The housing 210 may be disposed on an upper surface of the base 110. The housing 210 may be disposed below a holder 310. The housing 210 may accommodate a portion of the holder 310 and the camera module 600 therein. The housing 210 may comprise a plurality of sidewalls. The housing 210 may comprise four sidewalls. The housing 210 may comprise first to fourth sidewalls. The housing 210 may comprise a first sidewall and a second sidewall disposed opposite to each other, and a third sidewall and a fourth sidewall disposed opposite to each other between the first sidewall and the second sidewall. A coil 220 may be disposed on each of the first to fourth sidewalls of the housing 210.

The housing 210 may comprise a first groove 211. The first groove 211 may be formed in a sidewall of the housing 210. A coil 220 may be disposed in the first groove 211. That is, the first groove 211 may be an 'accommodating groove' for accommodating the coil 220. The first groove 211 may be formed by recessing an upper surface of the housing 210. As a modified embodiment, the first groove 211 may be provided in the form of a hole penetrating the sidewall of the housing 210 in a direction perpendicular to the optical axis. The first groove 211 may comprise a plurality of grooves. The first groove 211 may be formed in each of the four sidewalls of the housing 210.

The housing 210 may comprise a second groove 212. The second groove 212 may be formed in a sidewall of the housing 210. The space formed through the second groove 212 may pass through the third substrate 430. That is, the second groove 212 may be an 'avoiding groove' for avoiding interference with the third substrate 430. The second groove 212 may be formed by recessing a lower surface of the housing 210. The second groove 212 may comprise a plurality of grooves. The second groove 212 may be formed in each of sidewall at one side and sidewall at other side of the housing 210.

The housing 210 may comprise a hole 213. The hole 213 may be formed to penetrate through the housing 210 in a direction parallel to the optical axis. A wire 420 may be disposed in the hole 213. The hole 213 may be formed with a diameter that does not interfere with the wire 420. The hole 213 may be formed in a corner portion of the housing 210. The hole 213 may comprise a plurality of holes. The hole 213 may be formed in each of the four corner portions of the housing 210. However, as a modified embodiment, the hole 213 may be formed as a bottom closed groove. In this case, the lower end of the wire 420 may be fixed to the housing 210. The camera device 10A may comprise a coil 220. The coil 220 may be disposed in the housing 210. The coil 220 may face the magnet 320. The coil 220 may be coupled to the inner surface of the first substrate 230. The coil 220 may be electrically connected to the first substrate 230. When a current is applied to the coil 220, an electric field may be formed around the coil 220. When a current is applied to the coil 220, one of the coil 220 and the magnet 320 may move relative to the other through electromagnetic interaction between the coil 220 and the magnet 320. In this embodiment, when a current is applied to the coil 220, the magnet 320 may move. However, in a modified embodiment, the positions of the coil 220 and the magnet 320 may be disposed opposite to each other.

The coil 220 may comprise a first coil 221. The first coil 221 may face the first magnet 321. The first coil 221 may be electrically separated from the second coil 222 and the third coil 223. That is, the first to third coils 221, 222, and 223 may be individually controlled. The first to third coils 221, 222, and 223 may be independently controlled. In other words, the direction and amount of current applied to each of the first to third coils 221, 222, and 223 may be individually controlled. The first coil 221 may rotate the camera module 600 about a first axis perpendicular to the optical axis through interaction with the magnet 320. In this case, the first axis may be the x-axis.

As illustrated in FIG. 16(*b*), the first coil 221 may rotate the camera module 600 to one side about the x-axis through interaction with the magnet 320 (refer to b of FIG. 16(*b*)).

In more detail, when a forward current is applied to a first-first coil 221-1, an upward electromagnetic interaction force b1 between the first-first coil 221-1 and a first-first magnet 321-1 occurs, and when a forward current is applied to the first-second coils 221-2, a downward electromagnetic interaction b2 between the first-second coils 221-2 and a first-second magnets 321-2 occurs, so that the camera module 600 can rotate b to one side about the x-axis. However, it is not limited to applying a current in the same direction to the first-first coil 221-1 and the first-second coil 221-2, as a modified embodiment, currents in different directions can be applied. In addition, reverse currents may be applied to the first-first coil 221-1 and the first-second coil 221-2.

As illustrated in (b) 16(*e*), the first coil 221 can rotate camera module 600 to the other side about the x-axis through interaction with the magnet 320 (refer to e of FIG. 16(*e*)). In more detail, when a reverse current is applied to the first-first coil 221-1, an electromagnetic interaction force e1 is generated downward between the first-first coil 221-1 and the first-first magnet 321-1, and when a current is applied to upward direction to the first-second coils 221-2, an electromagnetic interaction force e2 is upwardly generated between the first-second coils 221-2 and the first-second magnets 321-2, so that the camera module 600 can rotate e to the other side about the x-axis.

The first coil 221 may comprise a plurality of coils. The first coil 221 may comprise a first-first coil 221-1 and a first-second coil 221-2. The first-first coil 221-1 may face the first-first magnet 321-1. The first-second coil 221-2 may face the first-second magnet 321-2. The first-first coil 221-1 may be disposed between the second-first coil 222-1 and the second-second coil 222-2. The first-second coil 221-2 may be disposed between a second-third coil 222-3 and a second-fourth coil 222-4. The first-first coil 221-1 and the first-second coil 221-2 may be electrically connected to each other. Through this, the first-first coil 221-1 and the first-second coil 221-2 can be integrally controlled. However, as another example, the first-first coil 221-1 and the first-second coil 221-2 may be electrically separated. In this case, the first-first coil 221-1 and the first-second coil 221-2 can be individually controlled. That is, the direction and amount of current applied to each of the first-first coil 221-1 and the first-second coil 221-2 can be individually controlled.

The coil 220 may comprise a second coil 222. The second coil 222 may face the first magnet 321. The second coil 222 may be electrically separated from the first coil 221. The second coil 222 can rotate the camera module 600 about a second axis perpendicular to an optical axis and the first axis through interaction with the magnet 320. At this time, the second axis may be a y-axis.

As illustrated in FIG. 16*a* (a) 16(*a*), the second coil 222 can rotate the camera module 600 to one side about the y-axis through interaction with the magnet 320 (refer to a in FIG. 16(*a*)). In more detail, when a forward current is applied to the second-first coil 222-1, an upward electromagnetic interaction force a1 is generated between the second-first coil 222-1 and the first-first magnet 321-1; when a forward current is applied to the second-third coil 222-3, an upward electromagnetic interaction force a1 is generated between the second-third coil 222-3 and the first-second magnet 321-2; when a reverse current is applied to the second-second coil 222-2, a downward electromagnetic interaction force a2 is generated between the second-second coil 222-2 and the first-first magnet 321-1; and when a reverse current is applied to the second-fourth coil 222-4, a downward electromagnetic interaction force a2 is generated between the second-fourth coil 222-4 and the first-second magnet 321-2, so that the camera module 600 can rotate a to one side about the y-axis. The electromagnetic interaction force a1 between the second-first coil 222-1 and the first-first magnet 321-1 and the electromagnetic interaction force a1 between the second-third coil 222-3 and the first-second magnet 321-2 is facing the same direction; the electromagnetic interaction force a2 between the second-second coil 222-2 and the first-first magnet 321-1 and the electromagnetic interaction force a2 between the second-fourth coil 222-4 and the first-second magnet 321-2 is facing the same direction; however, the electromagnetic interaction force a1 between the second-first coil 222-1 and the first-first magnet 321-1 and the electromagnetic interaction force a2 between the second-second coil 222-2 and the first-first magnet 321-1 may be directed toward different directions. For example, the electromagnetic interaction force a1 between the second-first coil 222-1 and the first-first magnet 321-1 and the electromagnetic interaction force a1 between the second-third coil 222-3 and the first-second magnet 321-2 is directing upward, and the electromagnetic interaction force a2 between the second-second coil 222-2 and the first-first magnet 321-1 and the electromagnetic interaction force a2 between the second-fourth coil 222-4 and the first-second magnet 321-2 may be directing downwards. Although it has been described that currents in different directions are applied to the second-first coil 222-1 and the second-second coil 222-2, in a modified embodiment, the winding directions of the coils are disposed opposite to each other and currents in the same direction may be applied.

As illustrated in FIG. 16(*d*), the second coil 222 can rotate the camera module 600 to the other side about the y-axis through interaction with the magnet 320 (refer to d in FIG. 16(*d*)). In more detail, when a reverse current is applied to the second-first coil 222-1, a downward electromagnetic interaction force d1 is generated between the second-first coil 222-1 and the first-first magnet 321-1; when a reverse current is applied to the second-third coil 222-3, a downward electromagnetic interaction force d1 is generated between the second-third coil 222-3 and the first-second magnet 321-2; when a forward current is applied to the second-second coil 222-2, an upward electromagnetic interaction force d2 is generated between the second-second coil 222-2 and the first-first magnet 321-1; and when a forward current is applied to the second-fourth coil 222-4, an upward electromagnetic interaction force d2 is generated between the second-fourth coil 222-4 and the first-second magnet 321-2, so that the camera module 600 can rotate d to the other side about the y-axis.

The second coil 222 may comprise a plurality of coils. The second coil 222 may comprise second-first to second-fourth coils 222-1, 222-2, 222-3, and 222-4. The second-first coil 222-1 may face the first-first magnet 321-1. The second-first coil 222-1 may be disposed on one side of the first-first coil 221-1. The second-second coil 222-2 may face the first-first magnet 321-1. The second-second coil 222-2 may be disposed on the other side of the first-first coil 221-1. The second-third coil 222-3 may face the first-second magnet 321-2. The second-third coil 222-3 may be disposed on one side of the first-second coil 221-2. The second-fourth coil 222-4 may face the first-second magnet 321-2. The second-fourth coil 222-4 may be disposed on the other side of the first-second coil 221-2.

The second-first to second-fourth coils 222-1, 222-2, 222-3, and 222-4 may be electrically connected. Through this, the second-first to second-fourth coils 222-1, 222-2, 222-3, and 222-4 may be integrally controlled. However, as another example, all of the second-first to second-fourth coils 222-1, 222-2, 222-3, and 222-4 may be electrically separated. In this case, the second-first to second-fourth coils 222-1, 222-2, 222-3, and 222-4 may be individually controlled. That is, the direction and amount of current applied to each of the second-first to second-fourth coils 222-1, 222-2, 222-3, and 222-4 may be individually controlled. As another example, the second-first coil 222-1 and the second-third coil 222-3 are electrically connected, and the second-second coil 222-2 and the second-fourth coil 222-4 are electrically connected, and the second-first coil 222-1 and the second-second coil 222-2 may be electrically separated.

The coil 220 may comprise a third coil 223. The third coil 223 may face the second magnet 322. The third coil 223 may be electrically separated from the first coil 221 and the second coil 222.

As illustrated in FIG. 16(c), the third coil 223 can rotate the camera module 600 to one side about the optical axis through interaction with the magnet 320 (see c of FIG. 16(c)). In more detail, when a forward current is applied to the third-first coil 223-1, an electromagnetic interaction force c1 is generated in the first direction between the third-first coil 223-1 and the second-first magnet 322-1, and when a forward current is applied to the third-second coil 223-2, an electromagnetic interaction force c2 is generated in the second direction between the third-second coil 223-2 and the second-second magnet 322-2, so that the camera module 600 can rotate c to one side about the z-axis. At this time, the first direction and the second direction are tangential directions of a circle centered on the optical axis, respectively, and may be symmetrical with respect to the optical axis. Although it has been described that a forward current is applied to each of the third-first coil 223-1 and the third-second coil 223-2, currents may be applied to the third-first coil 223-1 and the 3-2 coil 223-2 in different directions. At this time, a necessary electromagnetic interaction force can be induced through the disposed direction of the second-first magnet 322-1 and the second-second magnet 322-2 or the winding direction of the third-first coil 223-1 and the third-second coil 223-2.

As illustrated in FIG. 16(f), the third coil 223 can rotate the camera module 600 to the other side about the optical axis through interaction with the magnet 320 (refer to f in FIG. 16b (c) 16(f)). In more detail, when a reverse current is applied to the third-first coil 223-1, an electromagnetic interaction force f1 is generated in the third direction between the third-first coil 223-1 and the second-first magnet 322-1, and when a reverse current is applied to the third-second coil 223-2, an electromagnetic interaction force f2 is generated in the fourth direction between the third-second coil 223-2 and the second-second magnet 322-2, so that the camera module 600 can rotate f to the other side about the z-axis. At this time, the third direction and the fourth direction are tangential directions of a circle centered on the optical axis, respectively, and may be symmetrical with respect to the optical axis. In addition, the third direction may be opposite to the first direction and the fourth direction may be opposite to the second direction.

The third coil 223 may comprise a plurality of coils. The third coil 223 may comprise a third-first coil 223-1 and a third-second coil 223-2. The third-first coil 223-1 may face the second-first magnet 322-1. The third-second coil 223-2 may face the second-second magnet 322-2. The third-first coil 223-1 and the third-second coil 223-2 may be electrically connected to each other. Through this, the third-first coil 223-1 and the third-second coil 223-2 can be integrally controlled. However, as another example, the third-first coil 223-1 and the third-second coil 223-2 may be electrically separated. In this case, the third-first coil 223-1 and the third-second coil 223-2 can be individually controlled. That is, the direction and amount of current applied to each of third-first coil 223-1 and the third-second coil 223-2 can be individually controlled.

The camera device 10A may comprise a first substrate 230. The first substrate 230 may be disposed on the outer surface of the housing 210. The first substrate 230 may connect the printed circuit board 50 and the coil 220. The coil 220 may be coupled to the inner surface of the first substrate 230. A sensor 440 may be coupled to the inner surface of the first substrate 230. A lower end of the first substrate 230 may be coupled to the printed circuit board 50. The first substrate 230 may be flexible. The first substrate 230 may comprise a flexible printed circuit board (FPCB).

The first substrate 230 may comprise a plurality of substrates. The first substrate 230 may comprise a first-first substrate 230-1 and a first-second substrate 230-2. The first-first substrate 230-1 may be disposed on the first sidewall and the third sidewall of the housing 210. The first-second substrate 230-2 may be disposed on the second sidewall and the fourth sidewall of the housing 210. The first-first substrate 230-1 and the first-second substrate 230-2 may be formed to have corresponding shapes. The first-first substrate 230-1 and the first-second substrate 230-2 may be symmetrically disposed with respect to the central axis of the housing 210. Four coils may be coupled to each of the first-first substrate 230-1 and the first-second substrate 230-2. Two sensors may be coupled to each of the first-first substrate 230-1 and the first-second substrate 230-2.

The first substrate 230 may comprise a terminal 231. The terminal 231 may be formed at a lower end of the first substrate 230. The terminal 231 may be coupled to the terminal 50a of the printed circuit board 50 by soldering. The terminal 231 may comprise a plurality of terminals.

The first substrate 230 may comprise a bent portion 232. The first substrate 230 may comprise a flat portion disposed on the outer surface of the housing 210 and a bent portion 232 connecting the two flat portions. The bent portion 232 may be formed to be round. The first substrate 230 may have flexibility in the bent portion 232.

The camera device 10A may comprise a holder 310. At least a portion of the holder 310 may be disposed in the housing 210. A portion of the holder 310 may be disposed above the housing 210. The holder 310 may be coupled to the camera module 600. The camera module 600 may be disposed inside the holder 310. A magnet 320 may be disposed in the holder 310. The holder 310 may comprise an upper plate and a plurality of sidewalls being extended from the upper plate. A plurality of sidewalls of the holder 310 may be extended from the top plate along an outer peripheral surface of the camera module 600. The sidewall of the holder 310 may comprise first to fourth sidewalls corresponding to the sidewall of the housing 210.

The holder 310 may comprise a hole 311. The hole 311 may be a hollow hole. The hole 311 may be an opening. The hole 311 may be formed to penetrate through the holder 310 in the optical axis direction. A camera module 600 may be disposed in the hole 311. The hole 311 may be formed in a size corresponding to the camera module 600.

The holder 310 may comprise a protrusion 312. The protrusion 312 may be formed on an upper surface of the holder 310. An upper elastic member 410 may be coupled to the protrusion 312. The protrusion 312 may be formed to be protruded from an upper surface of the upper plate of the holder 310. The protrusion 312 may be formed between corners of the upper plate of the holder 310. The protrusion 312 may comprise a plurality of protrusions. The number of protrusions 312 may be formed to correspond to the number of first coupling portions 411 of the upper elastic member 410. The protrusion 312 may comprise four protrusions.

The holder 310 may comprise a stopper 313. The stopper 313 may be formed to be protruded from an upper surface of the holder 310. The stopper 313 may limit the upward movement of the holder 310. The stopper 313 may be an upper stopper. The stopper 313 may be overlapped with the upper plate 510 of the cover 500 in a direction parallel to the optical axis. The stopper 313 may comprise a plurality of protrusions. The stopper 313 may comprise eight protrusions.

The holder 310 may comprise a first hole 314. The first hole 314 may be formed in a sidewall of the holder 310. A magnet 320 may be disposed in the first hole 314. The first hole 314 may be a magnet accommodating hole. The first hole 314 may be formed in a size and shape corresponding to the magnet 320. The first hole 314 may comprise a plurality of holes. The number of first holes 314 may correspond to the number of magnets 320. The first hole 314 may comprise four holes.

The holder 310 may comprise a second hole 315. The second hole 315 may be formed to penetrate through the holder 310 in a direction parallel to the optical axis. The second hole 315 may be formed in a corner of the upper plate of the holder 310. The wire 420 may pass through the second hole 315. The second hole 315 may be formed to have a larger diameter than the wire 420 so as not to interfere with the wire 420. The second hole 315 may comprise a plurality of holes. The number of second holes 315 may correspond to the number of wires 420. The second hole 315 may comprise four holes.

The camera device 10A may comprise a magnet 320. The magnet 320 may be disposed on an outer peripheral surface of the camera module 600. The magnet 320 may face the coil 220. The magnet 320 may be disposed to face the coil 220. The magnet 320 may electromagnetically interact with the coil 220. When a current is applied to the coil 220, the magnet 320 can move. The magnet 320 may be a flat magnet having a flat plate shape. The magnet 320 may comprise a plurality of magnets. The magnet 320 may comprise four magnets.

The magnet 320 may comprise a first magnet 321. The first magnet 321 may be disposed on each of the first lateral surface and the second lateral surface of the camera module 600. The polarities of the upper and lower portions of the surface of the first magnet 321 facing the coil 220 may be different from each other. The first magnet 321 may be a single magnet having two poles. However, as a modified embodiment, the first magnet 321 may be a bipolar magnetizing magnet in which two single magnets having two poles are superimposed. An upper portion of the first magnet 321 is an N pole and a lower portion may be an S pole. However, in a modified embodiment, an upper portion of the first magnet 321 is an S pole and a lower portion may be an N pole. The first magnet 321 may face the first coil 221 and the second coil 222. The width of the first magnet 321 in the horizontal direction may correspond to the sum of the width of the first coil 221 and the width of the second coil 222.

The first magnet 321 may comprise a first-first magnet 321-1 and a first-second magnet 321-2. The first-first magnet 321-1 may be disposed on a first lateral surface of the camera module 600. The first-second magnet 321-2 may be disposed on a second lateral surface of the camera module 600.

The magnet 320 may comprise a second magnet 322. The second magnet 322 may be disposed on each of the third lateral surface and the fourth lateral surface of the camera module 600. The second magnet 322 may have different polarities on both sides of the surface facing the coil 220. Moreover, the first width of the first magnet 321 is greater than the second width of the second magnet 322.

The second magnet 322 may be a single magnet having two poles. However, as a modified embodiment, the second magnet 322 may be a bipolar magnetizing magnet in which two single magnets having two poles are superimposed. One lateral portion of the second magnet 322 may be an N pole and the other lateral portion may be an S pole. However, in a modified embodiment, one lateral portion of the second magnet 322 may be an S pole and the other lateral portion may be an N pole. At this time, one lateral portion may be a portion located on a left side of the second magnet 322, and the other lateral portion may be a portion located on the right side of the second magnet 322. The second magnet 322 may face the third coil 223. The width of the second magnet 322 in the horizontal direction may be greater than the width of the third coil 223. The second magnet 322 may comprise a second-first magnet 322-1 and a second-second magnet 322-2. The second-first magnet 322-1 may be disposed on the third lateral surface of the camera module 600. The second-second magnet 322-2 may be disposed on the fourth lateral surface of the camera module 600.

The camera device 10A may comprise an upper elastic member 410. A portion of the upper elastic member 410 may be coupled to the holder 310. The upper elastic member 410 may be fixed to the protrusion 312 of the holder 310 by an adhesive. The upper elastic member 410 may connect the holder 310 and the wire 420. The upper elastic member 410 may have elasticity at least in portion. The upper elastic member 410 may comprise a leaf spring.

As illustrated in FIGS. 17 and 18(*a*)-18(*c*), in the present embodiment, a contact support structure may be applied to the central portion of the lower surface of the camera module 600. At this time, the pre-load structure in which the entire camera module 600 receives a force in the direction of the base 110 is formed in a way that the upper elastic member 410 provided as a leaf spring to be subjected to offset bending after assembling the base 110, so that deflection by the posture difference due to gravity (refer to g of FIGS. 18(a)-18 (c)) can be inhibited. The present embodiment is a structure in which the upper elastic member 410 is offset bending to apply a pre-load in the state of product assembly, so in the present embodiment, even if a change in the direction of gravity occurs, the pre-load, which is the vertical drag, is sufficiently large compared to the weight of the camera module 600, so that deflection of the camera module 600 according to the posture difference may not occur. Referring to FIG. 18 (a), the offset banding structure that causes the height difference (refer to FIG. 17 (a) and FIG. 18 (a)) between the first coupling portion 411 and the second coupling portion 412 of the upper elastic member 410 can be confirmed. FIG. 18 (a) is a posture in which the camera module 600 is photographing above, FIG. 18 (b) is a posture in which the camera module 600 is photographing below, and FIG. 18 (c) is a posture in which the camera module 600 is photographing side. In other words, FIG. 18 (a) is a posture in which the lens 680 of the camera module 600 is disposed above the image sensor 695, and FIG. 18 (b) is a posture in which the lens 680 of the camera module 600 is disposed below the image sensor 695, and FIG. 18 (c) is a posture in which the center of the lens 680 of the camera module 600 and the center of the image sensor 695 are disposed at the same height. In the present embodiment, the offset bending shape of the upper elastic member 410 can be maintained in all postures comprising the three postures illustrated above. Through this, the posture difference deflection of the camera module 600 may be inhibited. As illustrated in FIG. 18 (c), a frictional force F acts between the camera module 600 and the protrusion 121 of the elastic member 120 by the pre-load of the upper elastic member 410, and through this, the posture difference deflection can be inhibited. However, the amount of offset bending of the upper elastic member 410 may be changed according to the posture.

The upper elastic member 410 may comprise a first coupling portion 411. The first coupling portion 411 may be coupled to the holder 310. The first coupling portion 411 may be coupled to an upper surface of the protrusion 312 of the holder 310 by an adhesive. The first coupling portion 411 may be formed with a width wider than the width of the connection portion 413.

The upper elastic member 410 may comprise a second coupling portion 412. The second coupling portion 412 may be connected to the wire 420. The second coupling portion 412 may be coupled to the wire 420. The second coupling portion 412 may be coupled to the wire 420 by soldering. The second coupling portion 412 may comprise a hole passing through which the wire 420 passes.

The upper elastic member 410 may comprise a connection portion 413. The connection portion 413 may connect the first coupling portion 411 and the second coupling portion 412. The connection portion 413 may have elasticity. The connection portion 413 may elastically connect the first coupling portion 411 and the second coupling portion 412. The connection portion 413 may be integrally formed with the first coupling portion 411 and the second coupling portion 412.

The camera device 10A may comprise a wire 420. The wire 420 may connect the elastic member 120 and the housing 210 or the elastic member 120 and the base 110. The upper end of the wire 420 may be coupled to the second coupling portion 412 of the upper elastic member 410. The lower end of the wire 420 may be coupled to the base 110. In a modified embodiment, the lower end of the wire 420 may be coupled to a lower portion of the housing 210. The wire 420 may pass through the hole of the second coupling portion 412 of the upper elastic member 410, the second hole 315 of the holder 310, and the hole 213 of the housing 210. The wire 420 may comprise a wire spring.

In this embodiment, through the electromagnetic interaction of the coil 220 and the magnet 320, a rotational force is generated about the X, Y, and Z axes, and the upper elastic member 410 provided as a leaf spring and the wire 420 provided as a wire spring are vertically disposed, and due to this, the rigidity against 3-axis rotation is decreased, thereby enabling the movement in yaw, pitch, and roll modes. That is, since the rigidity is lowered through the wire 420, the current consumed in the 3-axis rotation driving may be reduced in the present embodiment.

The wire 420 may comprise a plurality of wires. The wire 420 may comprise four wires. The wire 420 may comprise first to fourth wires. The first to fourth wires may be respectively disposed at four corners of the holder 310.

The camera device 10A may comprise a third substrate 430. The third substrate 430 may be coupled to the second substrate 690. The third substrate 430 may connect the second substrate 690 and the printed circuit board 50. The third substrate 430 may electrically connect the image sensor 695 and the printed circuit board 50. The third substrate 430 may elastically support the movement of the camera module 600. A portion of the third substrate 430 can move integrally with the camera module 600. The third substrate 430 may be flexible. The third substrate 430 may comprise a flexible printed circuit board (FPCB).

The third substrate 430 may comprise an inner portion 431. The inner portion 431 may be coupled to the second substrate 690. The inner portion 431 can move integrally with the camera module 600. The inner portion 431 may comprise a terminal 431-1. The terminal 431-1 may be connected to the terminal 690a disposed on a lower surface of the second substrate 690. The inner portion 431 may comprise a hole 431-2. The hole 431-2 of the inner portion 431 may be a hollow hole. The protrusion 121 of the elastic member 120 may be disposed in the hole 431-2 of the inner portion 431.

The third substrate 430 may comprise an outer portion 432. The outer portion 432 may be fixed to the base 110. The outer portion 432 may be coupled to the printed circuit board 50. The outer portion 432 may comprise a terminal 432-1. The terminals 432-1 of the outer portion 432 may be coupled to the terminals of the printed circuit board 50 by soldering. A first hole 434 may be formed in the outer portion 432. The first hole 434 may be coupled to the protrusion 113 of the base 1100. The first hole 434 may comprise a plurality of holes.

The third substrate 430 may comprise a connection portion 433. The connection portion 433 may connect the inner portion 431 and the outer portion 432. The connection portion 433 may be bent at least in portion. The connection portion 433 may be flexible. The connection portion 433 may be flexible. The connection portion 433 may have elasticity. The connection portion 433 may elastically connect the inner portion 431 and the outer portion 432.

The third substrate 430 may comprise a second hole 435. The second hole 435 may be formed to penetrate through the third substrate 430. The second hole 435 may be formed in a portion of the inner portion 431 and the connection portion 433. The width of the connection portion 433 is reduced through the second hole 435, and through this, the connection portion 433 can be more easily bent and moved. The second hole 435 may be formed in a central portion of the connection portion 433 in the width direction.

The camera device 10A may comprise a sensor 440. The sensor 440 may be disposed on the inner surface of the first substrate 230. The sensor 440 may comprise a Hall sensor (Hall IC). The sensor 440 may detect the magnetic force of the magnet 320. The movement of the camera module 600 may be detected in real time through the magnetic force of the magnet 320 detected by the sensor 440. Through this, OIS feedback control may be possible.

The sensor 440 may comprise a plurality of sensors. The sensor 440 may comprise four sensors. All of the yawing, pitching, and rolling of the camera module 600 may be detected through the four sensors. The sensor 440 may comprise first to fourth sensors. The first sensor and the second sensor face the first-first magnet 321-1, the third sensor faces the second-first magnet 322-1, and the fourth sensor may face the first-second magnet 321-2.

The sensor 440 may comprise a first Hall sensor that detects the movement amount and/or displacement of the magnet 320 in the x-axis direction. The sensor 440 may comprise a second Hall sensor that detects a movement amount and/or displacement of the magnet 320 in the y-axis direction. The sensor 440 may comprise a third Hall sensor that detects the movement amount and/or displacement of the magnet 320 in the z-axis direction. Yawing, pitching, and rolling of the camera module 600 may be detected through any two or more of the first Hall sensor, the second Hall sensor, and the third Hall sensor.

The camera device 10A may comprise a cover 500. The cover 500 may comprise a 'cover can'. The cover 500 may be disposed to surround the holder 310 and the housing 210. The cover 500 may be coupled to the base 110. The cover 500 may accommodate the camera module 600 inside. The cover 500 may form the outer appearance of the camera device 10A. The cover 500 may have a hexahedral shape with an open lower surface. The cover 500 may be a non-magnetic material. The cover 500 may be formed of metal. The cover 500 may be formed of a metal plate. The cover 500 may be connected to the ground portion of the printed circuit board 50. Through this, the cover 500 can be grounded. The cover 500 may block electromagnetic interference (EMI). At this time, the cover 500 may be referred to as an 'EMI shield can'.

The cover 500 may comprise an upper plate 510 and a lateral plate 520. The cover 500 may comprise an upper plate 510 comprising a hole, and a lateral plate 520 being extended downward from an outer circumference or edge of the upper plate 510. A lower end of the lateral plate 520 of the cover 500 may be disposed on the base 110. The inner surface of the lateral plate 520 of the cover 500 may be fixed to the base 110 by an adhesive.

The lateral plate 520 of the cover 500 may comprise a plurality of lateral plates. The plurality of lateral plates may comprise first to fourth lateral plates. The lateral plate 520 of the cover 500 may comprise a first lateral plate and a second lateral plate disposed opposite to each other, and a third lateral plate and a fourth lateral plate disposed on opposite sides between the first lateral plate and the second lateral plate.

The camera device 10A may comprise a camera module 600. The camera module 600 may comprise a lens driving device. The camera module 600 may comprise a voice coil motor (VCM). The camera module 600 may be disposed inside the housing 210. The camera module 600 may be disposed on the protrusion 121 of the elastic member 120.

The camera module 600 may pivot around the protrusion 121 of the elastic member 120. The camera module 600 may be coupled to the holder 310. The camera module 600 can move integrally with the holder 310. A magnet 320 may be disposed on the outer peripheral surface of the camera module 600. The camera module 600 can be yawing. The camera module 600 may be rotated, tilted, moved or pivoted in the yaw direction. The camera module 600 may be pitching. The camera module 600 may be rotated, tilted, moved or pivoted in the pitch direction. The camera module 600 may be rolling. The camera module 600 may be rotated, tilted, moved or pivoted in the roll direction.

The camera module 600 may comprise first to fourth lateral surfaces. The outer peripheral surface of the camera module 600 may comprise a first lateral surface and a second lateral surface disposed opposite to each other, and a third lateral surface and a fourth lateral surface disposed opposite to each other between the first lateral surface and the second lateral surface.

The camera module 600 may comprise a cover 610. The cover 610 may comprise a 'cover can'. The cover 610 may be disposed to surround the housing 620. The cover 610 may be coupled to the base 670. The cover 610 may form the outer appearance of the camera module 600. The cover 610 may have a hexahedral shape with an open lower surface. The cover 610 may be a non-magnetic material. The cover 610 may be formed of metal. The cover 610 may be formed of a metal plate. The cover 610 may be connected to the ground portion of the second substrate 690. Through this, the cover 610 can be grounded. The cover 610 may block electromagnetic interference (EMI). At this time, the cover 610 may be referred to as an 'EMI shield can'.

The cover 610 may comprise an upper plate 611 and a lateral plate 612. The cover 610 may comprise an upper plate 611 comprising a hole, and a lateral plate 612 being extended downward from an outer circumference or edge of the upper plate 611. A lower end of the lateral plate 612 of the cover 610 may be disposed on the base 670. The inner surface of the lateral plate 612 of the cover 610 may be fixed to the base 670 by an adhesive. The lateral plate 612 of the cover 610 may comprise a plurality of lateral plates. The plurality of lateral plates may comprise first to fourth lateral plates. The lateral plate 612 of the cover 610 may comprise a first lateral plate and a second lateral plate disposed opposite to each other, and a third lateral plate and a fourth lateral plate disposed on opposite sides between the first lateral plate and the second lateral plate.

The camera module 600 may comprise a housing 620. The housing 620 may be disposed outside the bobbin 640. The housing 620 may accommodate at least a portion of the bobbin 640. The housing 620 may be disposed inside the cover 610. The housing 620 may be disposed between the cover 610 and the bobbin 640. The housing 620 may be formed of a material different from that of the cover 610. The housing 620 may be formed of an insulating material. The housing 620 may be formed of an injection-molded material. A magnet 630 may be disposed in the housing 620. The housing 620 and the magnet 630 may be coupled by an adhesive. An upper elastic member 661 may be coupled to an upper portion of the housing 620. A lower elastic member 662 may be coupled to a lower portion of the housing 620. The housing 620 may be coupled to the elastic member 660 by thermal fusion and/or adhesive.

The camera module 600 may comprise a magnet 630. The magnet 630 may be disposed between the coil 650 and the lateral plate 612 of the cover 610. The magnet 630 may be disposed in the housing 620. The magnet 630 may be disposed between the bobbin 640 and the housing 620. The magnet 630 may be disposed between the bobbin 640 and the lateral plate 612 of the cover 610. The magnet 630 may be disposed between the coil 650 and the lateral plate 612 of the cover 610. The magnet 630 may face the coil 650. The magnet 630 may electromagnetically interact with the coil 650. The magnet 630 may be disposed on a lateral portion between the corner portions of the housing 620. At this time, the magnet 630 may be a flat magnet having a flat plate shape.

The magnet 630 may comprise a plurality of magnets. The magnet 630 may comprise four magnets. The magnet 630 may comprise a first magnet 631 and a second magnet 632 having a width smaller than that of the first magnet 631. The second magnet 632 may be disposed at a position corresponding to the second magnet 322. The second magnet 632 may be disposed in consideration of magnetic interference with the second magnet 322. The second magnet 632 may be disposed to be overlapped with only one side of the second magnet 322.

The camera module 600 may comprise a bobbin 640. The bobbin 640 may be disposed inside the cover 610. The bobbin 640 may be coupled to the lens 680. The bobbin 640 may be disposed inside the housing 620. The bobbin 640 may be disposed in the hole of the housing 620. The bobbin 640 may be movably coupled to the housing 620. The bobbin 640 may move in the optical axis direction with respect to the housing 620. A lens 680 may be coupled to the bobbin 640. The bobbin 640 and the lens 680 may be screw-coupled and/or by adhesive. A coil 650 may be coupled to the bobbin 640. An upper elastic member 661 may be coupled to an upper portion of the bobbin 640. A lower elastic member 662 may be coupled to a lower portion of the bobbin 640. The bobbin 640 may be coupled to the elastic member 660 by thermal fusion and/or adhesive.

The camera module 600 may comprise a coil 650. The coil 650 may be disposed on the bobbin 640. The coil 650 may be an 'AF driving coil' used for AF driving. The coil 650 may be disposed on the bobbin 640. The coil 650 may be disposed between the bobbin 640 and the housing 620. The coil 650 may be disposed between the bobbin 640 and the lateral plate 612 of the cover 610. The coil 650 may be disposed on an outer lateral surface or an outer peripheral surface of the bobbin 640. The coil 650 may be wound directly on the bobbin 640. Alternatively, the coil 650 may be coupled to the bobbin 640 in a direct wound state. The coil 650 may face the magnet 630. The coil 650 may be disposed to face the magnet 630. The coil 650 may electromagnetically interact with the magnet 630. In this case, an electromagnetic field is formed around the coil 650 when a current is supplied to the coil 650, and then the coil 650 can move with respect to the magnet 630 due to the electromagnetic interaction between the coil 650 and the magnet 630. The coil 650 may be formed as a single coil. In a modified embodiment, the coil 650 may comprise a plurality of coils spaced apart from each other.

The camera module 600 may comprise an elastic member 660. The elastic member 660 may be coupled to the bobbin 640. The elastic member 660 may connect the housing 620 and the bobbin 640. The elastic member 660 may be coupled to the housing 620 and the bobbin 640. The elastic member 660 may movably support the bobbin 640. The elastic member 660 may elastically support the bobbin 640. The elastic member 660 may have elasticity at least in portion. The elastic member 660 may support the movement of the bobbin 640 when AF driving. At this time, the elastic member 660 may be an 'AF support member'.

The elastic member 660 may comprise an upper elastic member 661. The upper elastic member 661 may be coupled to an upper portion of the bobbin 640 and an upper portion of the housing 620. The upper elastic member 661 may comprise an outer portion coupled to an upper portion of the housing 620, an inner portion coupled to an upper portion of the bobbin 640, and a connection portion connecting the outer portion and the inner portion. The upper elastic member 661 may be formed of a leaf spring.

The elastic member 660 may comprise a lower elastic member 662. The lower elastic member 662 may be coupled to a lower portion of the bobbin 640 and a lower portion of the housing 620. The lower elastic member 662 may comprise an outer portion coupled to a lower portion of the housing 620, an inner portion coupled to a lower portion of the bobbin 640, and a connection portion connecting the outer portion and the inner portion. The lower elastic member 662 may be formed of a leaf spring.

The camera module 600 may comprise a base 670. The base 670 may be disposed under the housing 620. The base 670 may be disposed on the second substrate 690. The base 670 may be disposed below the bobbin 640. The base 670 may be spaced apart from the bobbin 640 at least in portion. The base 670 may be coupled to the lateral plate 612 of the cover 610.

The camera module 600 may comprise a lens 680. The lens 680 may comprise a plurality of lenses. The lens 680 may be disposed at a position corresponding to the image sensor 695. The lens 680 may be disposed inside the barrel. Lens 680 may be coupled to bobbin 640 by screw-coupling and/or adhesive. The lens 680 can move integrally with the bobbin 640.

The camera module 600 may comprise a second substrate 690. An image sensor 695 may be disposed on the second substrate 690. The second substrate 690 may be a sensor substrate. The second substrate 690 may be a rigid printed circuit board (PCB). The second substrate 690 may be disposed below the base 670. The second substrate 690 may be disposed on the protrusion 121 of the elastic member 120. The second substrate 690 may be coupled to the third substrate 430. The second substrate 690 may be electrically connected to the printed circuit board 50 through the third substrate 430.

The camera module 600 may comprise an image sensor 695. The image sensor 695 may have a configuration in which light passing through the lens 680 and the filter is incident to form an image. The image sensor 695 may be mounted on the second substrate 690. The image sensor 695 may be electrically connected to the second substrate 690. For example, the image sensor 695 may be coupled to the second substrate 690 by a surface mounting technology (SMT). The image sensor 695 may be disposed so that the lens 680 and the optical axis coincide. That is, the optical axis of the image sensor 695 and the optical axis of the lens 680 can be aligned. The image sensor 695 may convert light irradiated to the effective image area of the image sensor 695 into an electrical signal. The image sensor 695 may be any one among a charge coupled device (CCD), a metal oxide semi-conductor (MOS), a CPD, and a CID.

The camera module 600 may comprise a filter. The filter may serve to block light of a specific frequency band from being incident on the image sensor 695 among the light passing through the lens 680. The filter may be disposed parallel to the x-y plane. A filter may be disposed between the lens 680 and the image sensor 695. The filter may be disposed on the base 670. The filter may comprise an infrared filter. The infrared filter may block light in the infrared region from being incident on the image sensor 695.

In a modified embodiment, the camera module 600 may comprise a variable lens. The variable lens may be a variable focus lens. The variable lens may be a lens whose focus is controlled. The focus may be adjusted by moving the lens and/or changing the shape of the lens.

A plurality of lenses may be disposed inside the lens barrel 686. The lens barrel 686 may comprise a hole penetrating the lens barrel 686 in a horizontal direction. At this time, the variable lens may be disposed by being inserted into a hole formed in the lens barrel 686. Meanwhile, the variable lens may be electrically connected to the printed circuit board 50. The camera module 600 may comprise a conductive line for electrically connecting the variable lens to the printed circuit board 50. At this time, the conductive line may be integrally formed with the components of the housing 620 and the base 670 through a molded interconnection device (MID) method. The variable lens may be electrically connected to the printed circuit board 50 through the second substrate 690 and the third substrate 430.

The variable lens may comprise a liquid lens 687. The variable lens may comprise a liquid lens 687 disposed between a plurality of lenses as illustrated in FIG. 6. The liquid lens 687 may be disposed in the lens 680. The liquid lens 687 may be disposed to be aligned with the lens 680. The plurality of lenses may comprise five lenses. The plurality of lenses may comprise first to fifth lenses 681, 682, 683, 684, and 685. At this time, the liquid lens 687 may be disposed between the second lens 682 and the third lens 683.

The liquid lens 687 whose focal length is adjusted in response to the driving voltage may receive an operating voltage through an upper terminal. The upper terminal may have the same angular distance and may comprise four individual terminals disposed in different directions. When an operating voltage is applied through the upper terminal, the interface between the conductive liquid and the non-conductive liquid formed in the lens region may be deformed. The lower terminal may be a common terminal. The upper terminal may be an upper electrode. The lower terminal may be a lower electrode. The liquid lens 687 may be spaced apart from the solid lens. Epoxy may be applied through the space between the liquid lens 687 and the solid lens, and active alignment of the liquid lens 687 may be performed. At this time, active alignment may refer to a process of operating the liquid lens and aligning the liquid lens 687 with the image sensor 695. Alternatively, the active alignment may refer to a process of operating the liquid lens and aligning the liquid lens 687 to the solid lens.

The variable lens may comprise at least one among a liquid lens 687, a polymer lens, a liquid crystal lens, a voice coil motor (VCM) actuator, a shape memory alloy (SMA) actuator, and a micro electro mechanical systems (MEMS) actuator. The liquid lens 687 may comprise at least one of a liquid lens 687 containing one type of liquid and a liquid lens 687 containing two types of liquid. The liquid lens 687 comprising one type of liquid may change the focus by adjusting a membrane disposed at a position corresponding to the liquid. For example, the focus can be changed by pressing the membrane by the electromagnetic force of the magnet and coil. The liquid lens 687 comprising two types of liquids may comprise a conductive liquid and a non-conductive liquid. In this case, the focus may be changed by adjusting the interface formed between the conductive liquid and the non-conductive liquid using a voltage applied to the liquid lens 687. The polymer lens can change the focus by controlling a polymer material through a driving unit such as a piezo. The liquid crystal lens can change the focus by controlling the liquid crystal by electromagnetic force. The VCM actuator can change focus by moving a solid lens or a lens assembly comprising a solid lens through electromagnetic force between a magnet and a coil. The SMA actuator may change a focus by moving a solid lens or a lens assembly comprising a solid lens using a shape memory alloy. The MEMS actuator may change the focus by moving a solid lens or a lens assembly comprising the solid lens through electrostatic force generated when voltage is applied.

The camera device 10A according to the present embodiment has a structure capable of 3-axis hand shake correction by adding roll correction, which is a Z-axis rotation mode, to the 2-axis correction module tilt method, so that high-quality video recording is possible by minimizing the effect of hand shake. Accordingly, the camera device 10A according to the present embodiment may be applied to a camcorder, an action camera, and the like as well as a smart phone.

The camera device 10A according to the present embodiment has a structure similar to that of an OIS VCM of a lens shift method and may utilize an existing method in the assembling process.

Hereinafter, an optical apparatus according to the present embodiment will be described with reference to the drawings.

Figure 21:
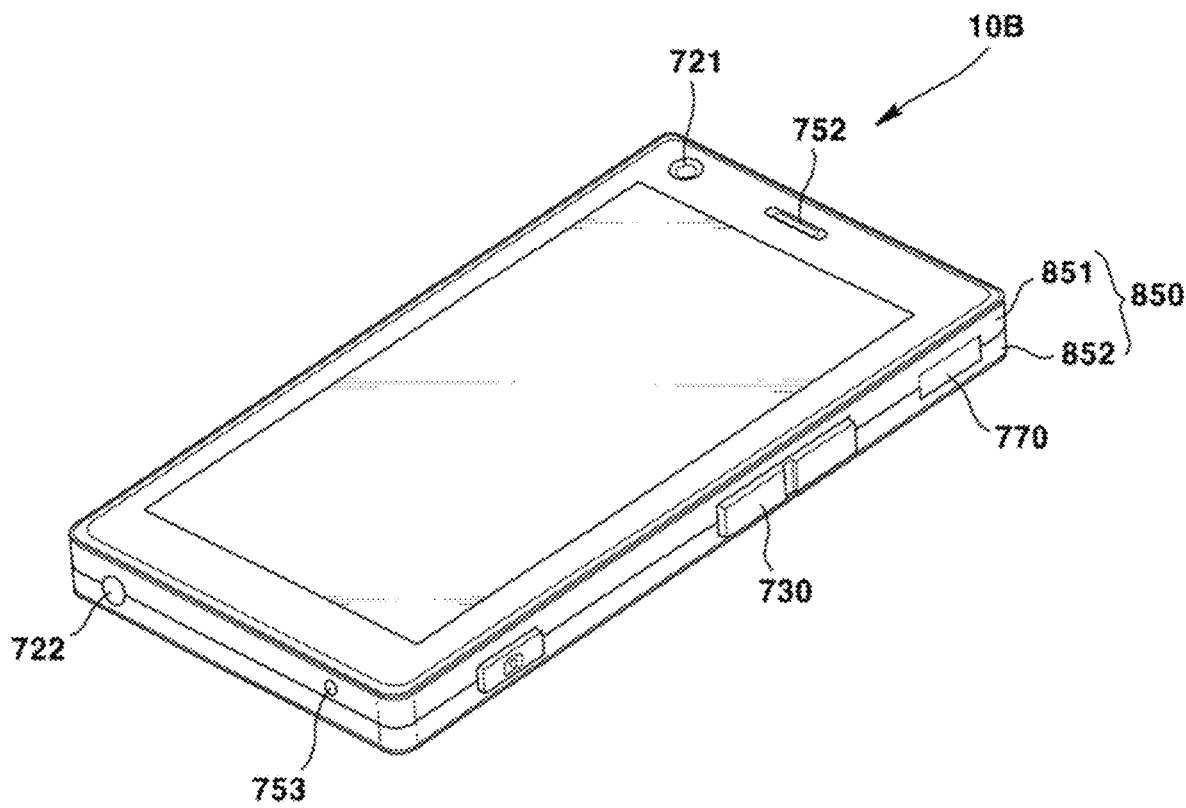
FIG. 21 is a perspective view of the optical apparatus according to the present embodiment.

FIG. 21 is a perspective view of the optical apparatus according to the present embodiment, and FIG. 22 is a block diagram of an optical apparatus illustrated in FIG. 21. The optical apparatus 10B may be any one among a mobile phone, a mobile phone, a smart phone, a portable smart device, a digital camera, a laptop computer, a digital broadcasting terminal, a PDA (Personal Digital Assistants), a PMP (Portable Multimedia Player), and a navigation device. However, the type of the optical apparatus 10B is not limited thereto, and any device for photographing an image or a picture may be comprised in the optical apparatus 10B. The optical apparatus 10B may comprise a main body 850. The main body 850 may have a bar shape. Alternatively, the main body 850 may have various structures such as a slide type, a folder type, a swing type, a swivel type, in which two or more sub-bodies are coupled to be relatively movable. The main body 850 may comprise a case (casing, housing, and cover) forming an outer appearance. For example, the main body 850 may comprise a front case 851 and a rear case 852. In a space formed between the front case 851 and the rear case 852, various electronic components of the optical apparatus 10B can be embedded. A display 751 may be disposed on one surface of the main body 850. A camera 721 may be disposed on one or more surfaces of one surface of the main body 850 and the other surface disposed opposite to the one surface.

The optical apparatus 10B may comprise a wireless communication unit 710. The wireless communication unit 710 may comprise one or more modules that enable wireless communication between the optical apparatus 10B and the wireless communication system or between the optical apparatus 10B and the network in which the optical apparatus 10B is located. For example, the wireless communication unit 710 may comprise any one or more of a broadcast reception module 711, a mobile communication module 712, a wireless Internet module 713, a short-range communication module 714, and a location information module 715.

The optical apparatus 10B may comprise an A/V input unit 720. The audio/video (A/V) input unit 720 is for inputting an audio signal or a video signal, and may comprise any one or more of a camera 721 and a microphone 722. At this time, the camera 721 may comprise the camera device 10A according to the present embodiment.

The optical apparatus 10B may comprise a sensing unit 740. The sensing unit 740 can generate a sensing signal for controlling the operation of the optical apparatus 10B by detecting the current state of the optical apparatus 10B such as the opening/closing state of the optical apparatus 10B, the position of the optical apparatus 10B, the presence or absence of user contact, the orientation of the optical apparatus 10B, acceleration/deceleration of the optical apparatus 10B, and the like. For example, when the optical apparatus 10B is in the form of a slide phone, it is possible to sense whether the slide phone is opened or closed. In addition, it may be responsible for a sensing function related to whether the power supply unit 790 is supplied with power, whether the interface unit 770 is coupled to an external device, and the like.

The optical apparatus 10B may comprise an input/output unit 750. The input/output unit 750 may be a configuration for generating an input or output related to visual, auditory, or tactile sense. The input/output unit 750 may generate input data for controlling the operation of the optical apparatus 10B, and may also output information processed by the optical apparatus 10B.

The input/output unit 750 may comprise any one or more among a keypad unit 730, a display 751, a sound output module 752, and a touch screen panel 753. The keypad unit 730 may generate input data in response to a keypad input. The display 751 may output an image photographed by the camera 721. The display 751 may comprise a plurality of pixels whose color changes according to an electrical signal. For example, the display 751 may comprise at least one among a liquid crystal display, a thin film transistor-liquid crystal display, an organic light-emitting diode, a flexible display, or a three-dimensional display (3D display). The sound output module 752 may output audio data received from the wireless communication unit 710 in a call signal reception, a call mode, a recording mode, a voice recognition mode, or a broadcast reception mode, or may output audio data stored in the memory unit 760. The touch screen panel 753 may convert a change in capacitance generated due to a user's touch on a specific area of the touch screen into an electrical input signal.

The optical apparatus 10B may comprise a memory unit 760. The memory unit 760 may store a program for processing and controlling the control unit 780. In addition, the memory unit 760 may store input/output data, for example, any one or more among a phone book, a message, an audio, a still image, a photo, and a video. The memory unit 760 may store an image photographed by the camera 721, for example, a photo or a video.

The optical apparatus 10B may comprise an interface unit 770. The interface unit 770 serves as a passage for connecting to an external device connected to the optical apparatus 10B. The interface unit 770 may receive data from an external device, receive power and transmit it to each component inside the optical apparatus 10B, or transmit data inside the optical apparatus 10B to an external device. The interface unit 770 may comprise any one or more among a wired/wireless headset port, an external charger port, a wired/wireless data port, a memory card port, a port for connecting a device equipped with an identification module, and an audio input/output (I/O) port, a video input/output (I/O) port, and an earphone port.

The optical apparatus 10B may comprise a control unit 780. The control unit 780 may control the overall operation of the optical apparatus 10B. The control unit 780 may perform related control and processing for voice call, data communication, video call, and the like. The control unit 780 may comprise a multimedia module 781 for playing multimedia. The multimedia module 781 may be provided inside the control unit 780 or may be provided separately from the control unit 780. The control unit 780 may perform a pattern recognition process capable of recognizing a handwriting input or a drawing input performed on the touch screen as characters and images, respectively.

The optical apparatus 10B may comprise a power supply unit 790. The power supply unit 790 may receive external power or internal power under the control of the control unit 780 to supply power required for operation of each component.

The embodiments of the present invention have been described above with reference to the accompanying drawings, but a person skilled in the art to which the present invention belongs may understand that the present invention can be implemented in other specific forms without changing the technical spirit or essential features. Therefore, it should be understood that the embodiments described above are illustrative and non-limiting in all respects.

The invention claimed is:

1. A camera device comprising:
   a base;
   an elastic member disposed on the base and comprising a protrusion;
   a housing disposed on the base;
   a camera module comprising a lens and an image sensor and disposed on the protrusion of the elastic member in the housing;
   a magnet disposed on an outer peripheral surface of the camera module; and
   a coil disposed on the housing and facing the magnet,
   wherein the outer peripheral surface of the camera module comprises a first lateral surface and a second lateral surface disposed opposite to each other and a third lateral surface and a fourth lateral surface disposed opposite to each other,
   wherein the magnet comprises a first magnet disposed on each of the first lateral surface and the second lateral surface of the camera module and a second magnet disposed on each of the third lateral surface and the fourth lateral surface of the camera module,
   wherein the coil comprises a first coil facing the first magnet, a second coil facing the first magnet and electrically separated from the first coil, and a third coil facing the second magnet and electrically separated from the first coil and the second coil,
   wherein the first magnet comprises a first surface facing the first or/and second coil and having different polarities on an upper portion and a lower portion thereof and,
   wherein the second magnet comprises a second surface facing the third coil and having different polarities on both lateral portions thereof.

2. The camera device of claim 1, wherein the first magnet comprises a first-first magnet disposed on the first lateral surface of the camera module and a first-second magnet disposed on the second lateral surface of the camera module, and
   wherein the first coil comprises a first-first coil facing the first-first magnet and a first-second coil facing the first-second magnet.

3. The camera device of claim 2, wherein the second coil comprises a second-first coil facing the first-first magnet and disposed on one side of the first-first coil, a second-second coil facing the first-first magnet and disposed on the other side of the first-first coil, a second-third coil facing the first-second magnet and disposed on one side of the first-second coil, and a second-fourth coil facing the first-second magnet and disposed on the other side of the first-second coil.

4. The camera device of claim 3, wherein the second magnet comprises a second-first magnet disposed on the third lateral surface of the camera module and a second-second magnet disposed on the fourth lateral surface of the camera module, and
wherein the third coil comprises a third-first coil facing the second-first magnet and a third-second coil facing the second-second magnet.

5. The camera device of claim 1, comprising:
a holder, at least a portion of the holder being disposed in the housing and coupled to the camera module;
an upper elastic member comprising a portion coupled to the holder; and
a wire connecting the upper elastic member and the base.

6. The camera device of claim 5, comprising a first substrate disposed on an outer surface of the housing,
wherein the coil is coupled to an inner surface of the first substrate.

7. The camera device of claim 6, wherein the camera module comprises a second substrate on which the image sensor is disposed and a flexible third substrate coupled to the second substrate, and
wherein the third substrate comprises an inner portion comprising a terminal connected to a terminal disposed on a lower surface of the second substrate, an outer portion fixed to the base and comprising a terminal, and a connection portion connecting the inner portion and the outer portion, and wherein at least a portion of the connection portion is bent.

8. The camera device of claim 1, wherein the camera module comprises
a cover comprising an upper plate and a lateral plate extending from the upper plate;
a bobbin disposed in the cover and coupled to the lens;
a coil disposed on the bobbin;
another magnet disposed between the coil of the camera module and the lateral plate of the cover; and
an elastic member coupled to the bobbin.

9. The camera device of claim 1, wherein the lens of the camera module comprises a plurality of lenses, and
wherein the camera module comprises a liquid lens disposed between the plurality of lenses.

10. The camera device of claim 1, wherein the first magnet comprises the first surface facing the first or/and second coil and having a first width in a first direction perpendicular to an optical axis direction,
wherein the second magnet comprises the second surface facing the third coil and having a second width in a second direction perpendicular to both the optical axis direction and the first direction, and
wherein the first width of the first magnet is greater than the second width of the second magnet.

11. The camera device of claim 5, wherein the upper elastic member comprises a first coupling portion coupled to the holder, a second coupling portion coupled to the wire, and a connection portion connecting the first coupling portion and the second coupling portion, and
wherein the first coupling portion is disposed higher than the second coupling portion.

12. The camera device of claim 8, wherein the magnet of the camera module comprises the first magnet and the second magnet having a width smaller than that of the first magnet of the camera module.

13. The camera device of claim 1, wherein the elastic member comprises a coupling portion disposed on the base, and a connection portion elastically connecting the protrusion and the coupling portion.

14. The camera device of claim 1, wherein the first coil is configured to rotate the camera module about a first axis perpendicular to an optical axis through interaction with the first magnet,
wherein the second coil is configured to rotate the camera module about a second axis perpendicular to both the optical axis and the first axis through interaction with the first magnet, and
wherein the third coil is configured to rotate the camera module about the optical axis through interaction with the second magnet.

15. An optical apparatus comprising:
a main body;
the camera device of claim 1 disposed on the main body; and
a display disposed on the main body and configured to output an image photographed by the camera device.

16. A camera device comprising:
a base;
an elastic member disposed on the base and comprising a protrusion;
a housing disposed on the base;
a camera module comprising a lens and an image sensor and disposed on the protrusion of the elastic member in the housing;
a magnet disposed on an outer peripheral surface of the camera module; and
a coil disposed on the housing and facing the magnet,
wherein the magnet comprises a first magnet and a second magnet,
wherein the coil comprises a first coil rotating the camera module about a first axis perpendicular to an optical axis through interaction with the first magnet, a second coil rotating the camera module about a second axis perpendicular to the optical axis and the first axis through interaction with the first magnet, and a third coil rotating the camera module about the optical axis through interaction with the second magnet, and
wherein the second coil is disposed on both sides of the first coil.

17. A camera device comprising:
a base;
a camera module comprising a lens and an image sensor;
an elastic member connecting the base and the camera module;
a magnet disposed on an outer peripheral surface of the camera module; and
a coil facing the magnet,
wherein the outer peripheral surface of the camera module comprises a first lateral surface and a second lateral surface disposed opposite to each other and a third lateral surface and a fourth lateral surface disposed opposite to each other,
wherein the magnet comprises a first magnet disposed on each of the first lateral surface and the second lateral surface of the camera module and a second magnet disposed on each of the third lateral surface and the fourth lateral surface of the camera module, wherein the coil comprises a first coil facing the first magnet, a second coil facing the first magnet and electrically separated from the first coil, and a third coil facing the second magnet and electrically separated from the first coil and the second coil, wherein the first magnet comprises a surface facing the first or/and the second coil and having different polarities on an upper portion and a lower portion thereof, and wherein the second magnet comprises a surface facing the third coil and having different polarities on both lateral portions thereof.

18. The camera device of claim 17, wherein the first magnet comprises a surface facing the coil and having a first width in a first direction perpendicular to an optical axis direction, wherein the second magnet comprises a surface facing the coil and having a second width in a second direction perpendicular to both the optical axis direction and the first direction, and wherein the first width of the first magnet is greater than the second width of the second magnet.

19. The camera device of claim 17, wherein the first coil is configured to rotate the camera module about a first axis perpendicular to an optical axis through interaction with the first magnet, wherein the second coil is configured to rotate the camera module about a second axis perpendicular to both the optical axis and the first axis through interaction with the first magnet, and wherein the third coil is configured to rotate the camera module about the optical axis through interaction with the second magnet.

* * * * *